US012575388B2

(12) United States Patent
Chang et al.

(10) Patent No.: US 12,575,388 B2
(45) Date of Patent: Mar. 10, 2026

(54) SEMICONDUCTOR DEVICE

(71) Applicant: SAMSUNG ELECTRONICS CO., LTD., Suwon-si (KR)

(72) Inventors: Jihoon Chang, Yongin-si (KR); Sooho Shin, Hwaseong-si (KR); Dongwan Kim, Hwaseong-si (KR); Dongsik Park, Suwon-si (KR); Chansic Yoon, Anyang-si (KR); Hyeonwoo Jang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 571 days.

(21) Appl. No.: 17/859,284

(22) Filed: Jul. 7, 2022

(65) Prior Publication Data

US 2023/0108547 A1 Apr. 6, 2023

(30) Foreign Application Priority Data

Oct. 1, 2021 (KR) ........................ 10-2021-0130833

(51) Int. Cl.
| | |
|---|---|
| *H01L 21/762* | (2006.01) |
| *H10B 12/00* | (2023.01) |
| *H10D 64/27* | (2025.01) |

(52) U.S. Cl.
CPC ..... *H01L 21/76224* (2013.01); *H10B 12/315* (2023.02); *H10B 12/34* (2023.02); *H10B 12/50* (2023.02); *H10D 64/512* (2025.01); *H10D 64/516* (2025.01); *H10D 64/518* (2025.01)

(58) Field of Classification Search
CPC . H01L 21/76224; H10B 12/09; H10B 12/315; H10B 12/50; H10B 12/34; H10D 64/512; H10D 64/516; H10D 64/518
See application file for complete search history.

(56) References Cited

U.S. PATENT DOCUMENTS

| | | | |
|---|---|---|---|
| 6,200,881 | B1 | 3/2001 | Lou |
| 6,576,530 | B1 | 6/2003 | Chen et al. |
| 6,642,125 | B2 | 11/2003 | Oh et al. |
| 6,717,231 | B2 | 4/2004 | Kim et al. |
| 9,331,144 | B2 | 5/2016 | Ujihara et al. |
| 2004/0021197 | A1 | 2/2004 | Oh |
| 2006/0220144 | A1* | 10/2006 | Anezaki ............ H01L 21/76229 257/E21.547 |

(Continued)

FOREIGN PATENT DOCUMENTS

| | | |
|---|---|---|
| KR | 10-0382728 B1 | 5/2003 |
| KR | 10-0487513 B1 | 7/2005 |

(Continued)

*Primary Examiner* — Vongsavanh Sengdara
(74) *Attorney, Agent, or Firm* — Muir Patent Law, PLLC

(57) ABSTRACT

A semiconductor device including a substrate including a trench; an isolation structure including an inner wall oxide layer pattern, a liner pattern, and a filling insulation pattern stacked in the trench; and a gate structure on the substrate and the isolation structure, wherein the inner wall oxide layer pattern and the liner pattern are conformally formed on a surface of the trench, a top surface of the inner wall oxide layer pattern is lower than an upper surface of the substrate, and a boundary between an upper surface of the inner wall oxide layer pattern and an upper surface of the liner pattern has no step difference.

20 Claims, 35 Drawing Sheets

(56)  References Cited

U.S. PATENT DOCUMENTS

| | | | | |
|---|---|---|---|---|
| 2006/0281245 A1* | 12/2006 | Okuno | H10D 84/0188 | |
| | | | 438/424 | |
| 2009/0029556 A1* | 1/2009 | Liao | H01L 21/76224 | |
| | | | 257/E21.249 | |
| 2015/0187937 A1* | 7/2015 | Sridhar | H01L 21/76224 | |
| | | | 257/408 | |

FOREIGN PATENT DOCUMENTS

| | | | |
|---|---|---|---|
| KR | 1020050080549 A | 8/2005 | |
| KR | 1020070001491 A | 1/2007 | |
| KR | 10-0703836 B1 | 4/2007 | |
| KR | 1020080095728 A | 10/2008 | |
| KR | 10-1128914 B1 | 3/2012 | |
| KR | 1020140125534 A | 10/2014 | |

* cited by examiner

SECOND
DIRECTION

FIRST
DIRECTION

FIG. 19

SECOND
DIRECTION

FIRST
DIRECTION

SECOND
DIRECTION

FIRST
DIRECTION

SEMICONDUCTOR DEVICE

CROSS-REFERENCE TO RELATED APPLICATION

This application claims priority under 35 USC § 119 to Korean Patent Application No. 10-2021-0130833, filed on Oct. 1, 2021, in the Korean Intellectual Property Office (KIPO), the contents of which are incorporated by reference herein in their entirety.

BACKGROUND

1. Field

Embodiments relate to a semiconductor device.

2. Description of the Related Art

A semiconductor device may include an isolation structure for separating an active region and an isolation region. Transistors included in the semiconductor device may be formed on the active region and the isolation region.

SUMMARY

The embodiments may be realized by providing a semiconductor device including a substrate including a trench; an isolation structure including an inner wall oxide layer pattern, a liner pattern, and a filling insulation pattern stacked in the trench; and a gate structure on the substrate and the isolation structure, wherein the inner wall oxide layer pattern and the liner pattern are conformally formed on a surface of the trench, a top surface of the inner wall oxide layer pattern is lower than a top surface of the substrate, and a boundary between a top surface of the inner wall oxide layer pattern and a top surface of the liner pattern has no step difference.

The embodiments may be realized by providing a semiconductor device including a substrate including a trench; an inner wall oxide layer pattern conformally on an inner wall of the trench, the inner wall oxide layer pattern having a top surface lower than a top surface of the substrate so as to expose an upper sidewall of the trench; a liner pattern conformally on the inner wall oxide layer pattern; a filling insulation pattern on the liner pattern, the filling insulation pattern filling remaining parts of the trench; and a gate structure on a surface of the substrate and the inner wall oxide layer pattern, the liner pattern, and the filling insulation pattern in the trench, the gate structure including a gate oxide layer pattern, a gate electrode, and a capping layer pattern, wherein top surfaces of the inner wall oxide layer pattern, the liner pattern, and the filling insulation pattern in the trench are lower than the top surface of the substrate such that the upper sidewall of the trench is exposed, and an uppermost part of the top surface of the inner wall oxide layer pattern is the same as or higher than an uppermost part of the top surface of the liner pattern.

The embodiments may be realized by providing a semiconductor device including a substrate including a first region and a second region; first trenches in the first region of the substrate; a first isolation structure in each of the first trenches, the first isolation structure including an insulation material; memory cells on the substrate and the first isolation structure in the first region; second trenches in the second region of the substrate; a second isolation structure in each of the second trenches, the second isolation structure including an inner wall oxide layer pattern, a liner pattern, and a filling insulation pattern sequentially stacked; and a gate structure on the substrate and the second isolation structure in the second region, the gate structure including a gate oxide layer pattern, a gate electrode, and a capping layer pattern, wherein a top surface of the second isolation structure in the second trench is lower than a top surface of the substrate such that an upper sidewall of the second trench is exposed, and an uppermost part of a top surface of the inner wall oxide layer pattern is at a same level as or higher than an uppermost part of a top surface of the liner pattern.

BRIEF DESCRIPTION OF THE DRAWINGS

Features will be apparent to those of skill in the art by describing in detail exemplary embodiments with reference to the attached drawings in which:

FIGS. 1 and 2 are cross-sectional views of a semiconductor device in accordance with example embodiments;

FIGS. 6 to 14 are cross-sectional views of stages in a method of manufacturing a semiconductor device in accordance with example embodiments;

FIGS. 16 and 17 are cross-sectional views of DRAM devices in accordance with example embodiments;

FIGS. 19 to 35 are cross-sectional views and plan views of stages in a method of manufacturing a DRAM device in accordance with example embodiments.

DETAILED DESCRIPTION

Figure 1:
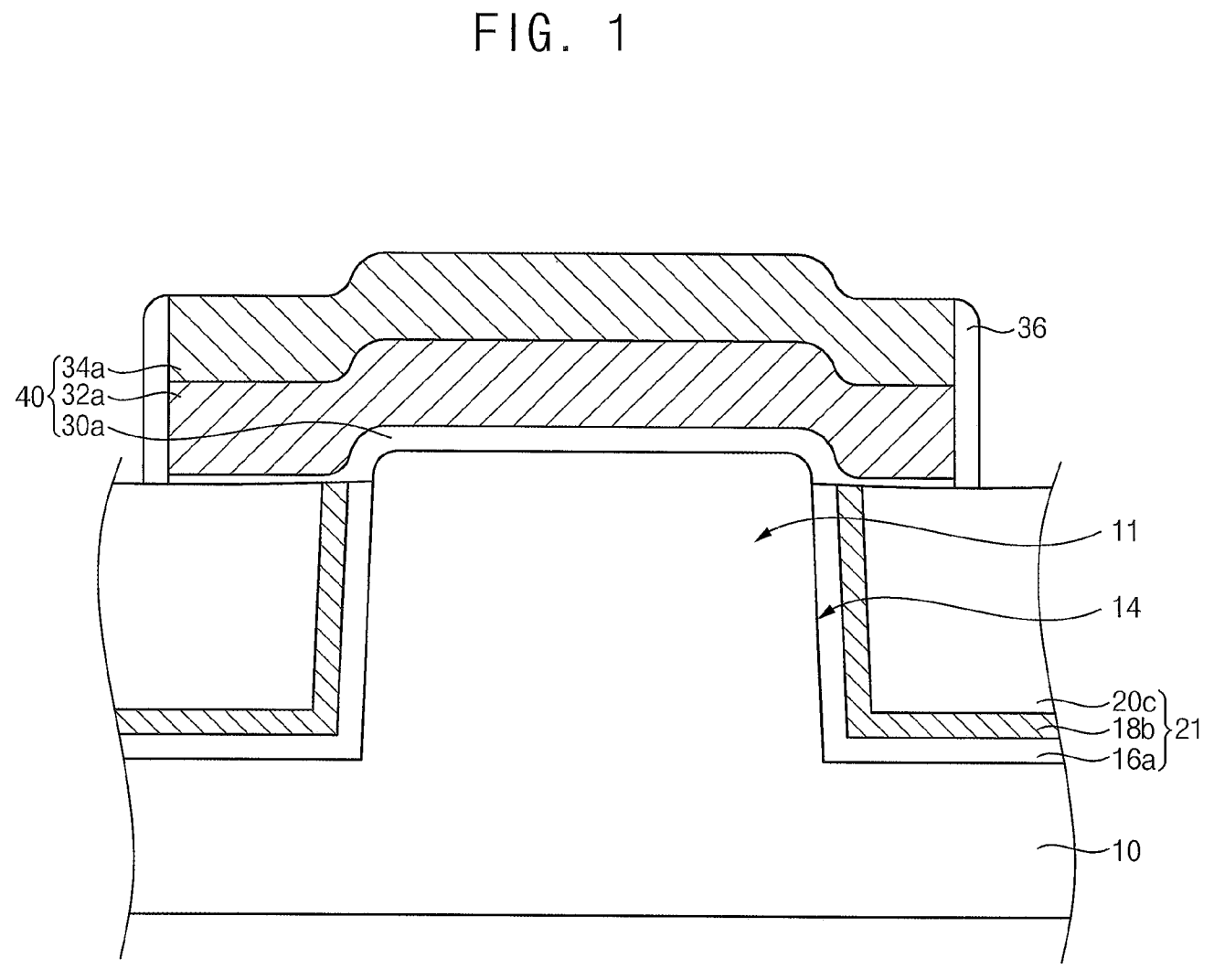
Figure 2:
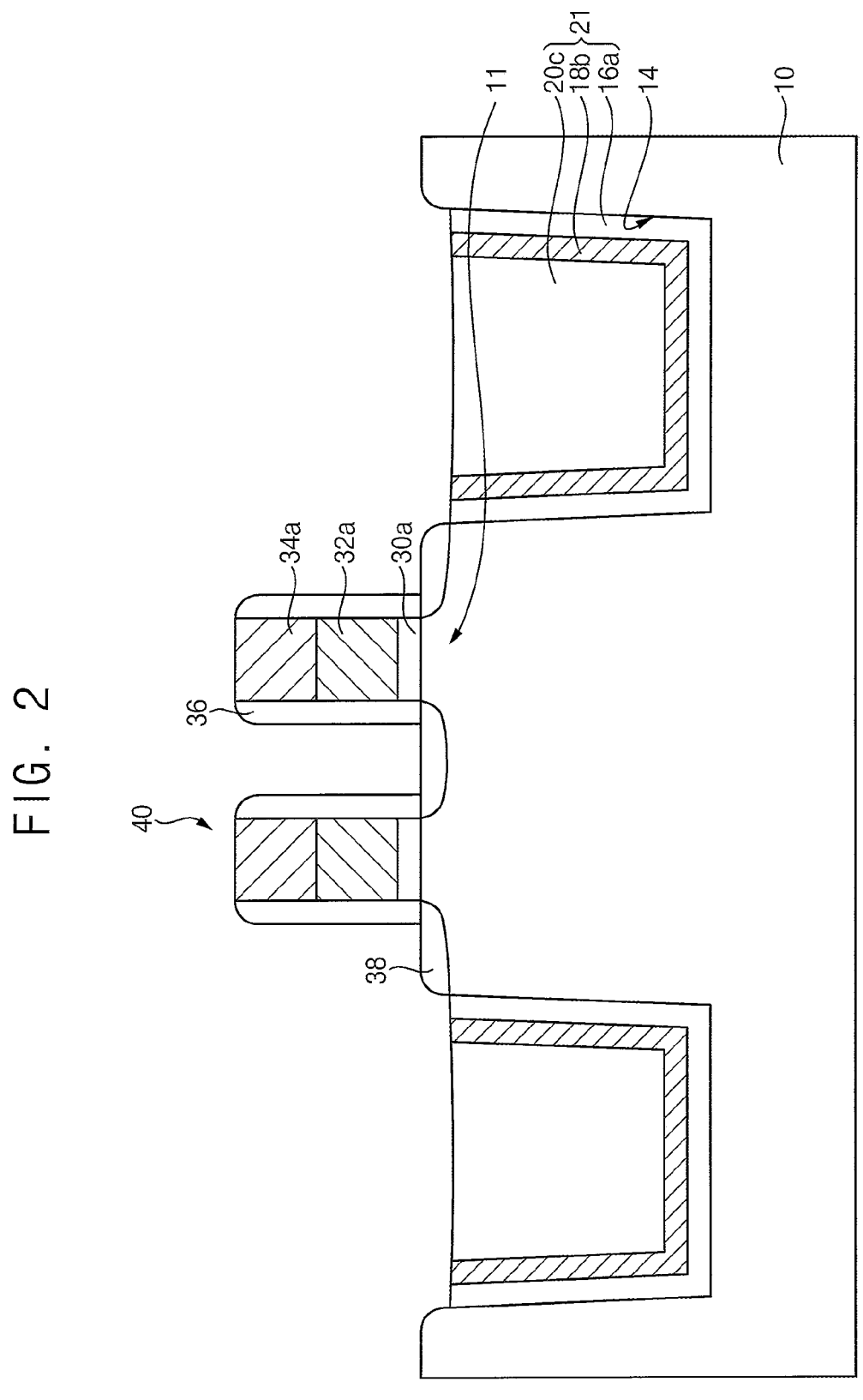
Figure 3:
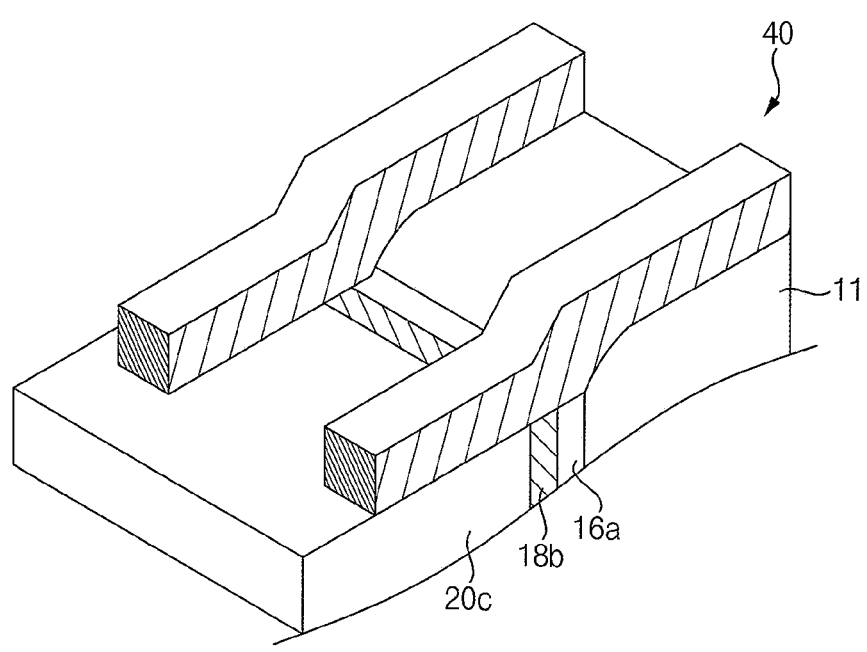
FIG. 3 is a perspective view of a portion of a semiconductor device in accordance with example embodiments.
Figure 4:
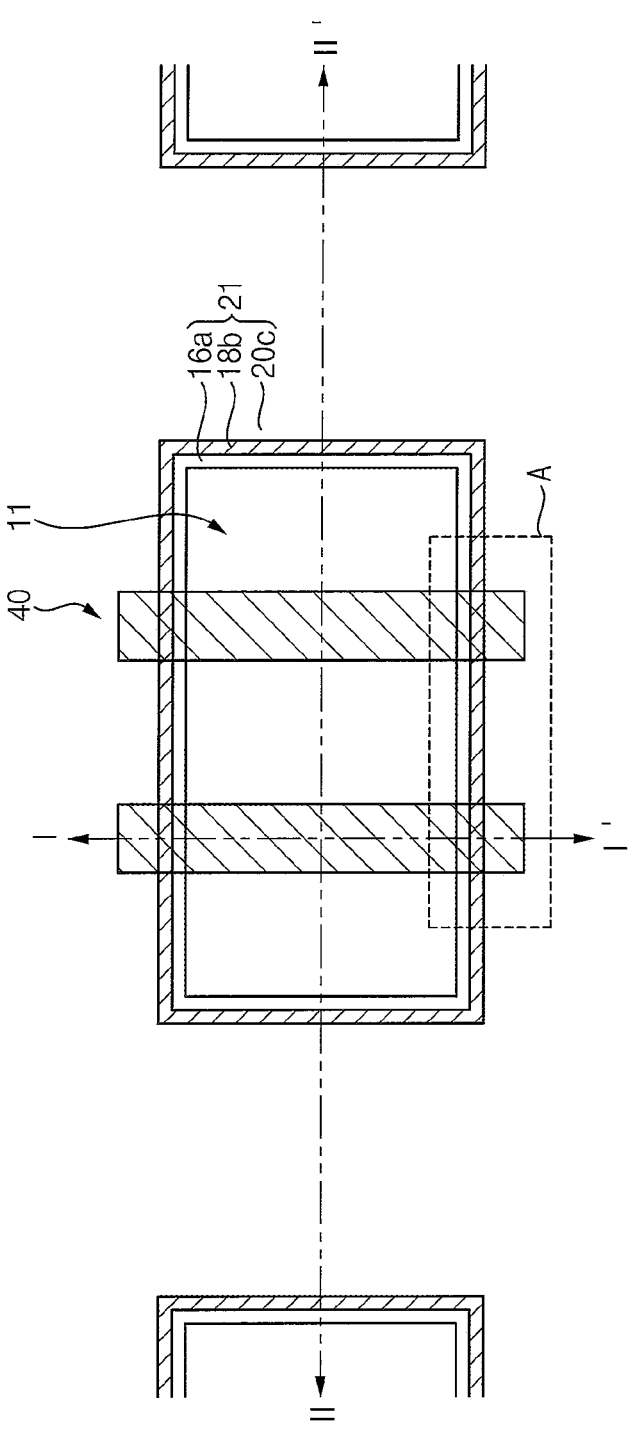
FIG. 4 is a plan view of a semiconductor device in accordance with example embodiments.
Figure 5A:
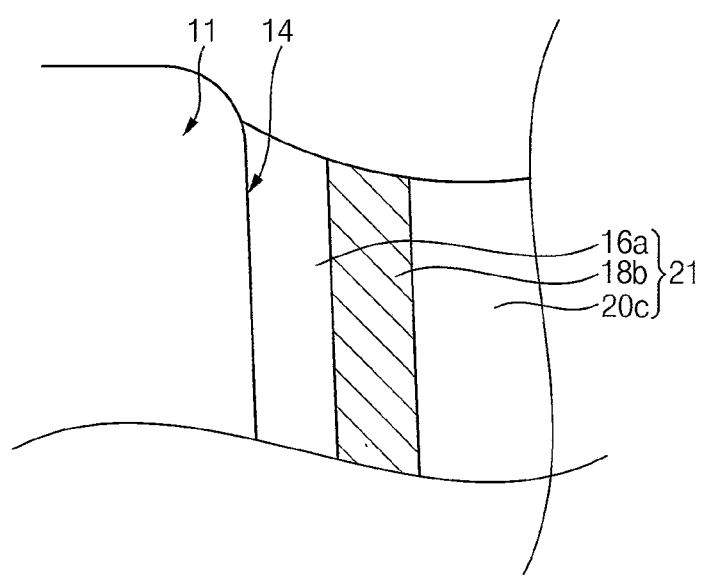
FIGS. 5A and 5B are cross-sectional views of a portion of an isolation structure of the semiconductor device in accordance with example embodiments.
Figure 5B:
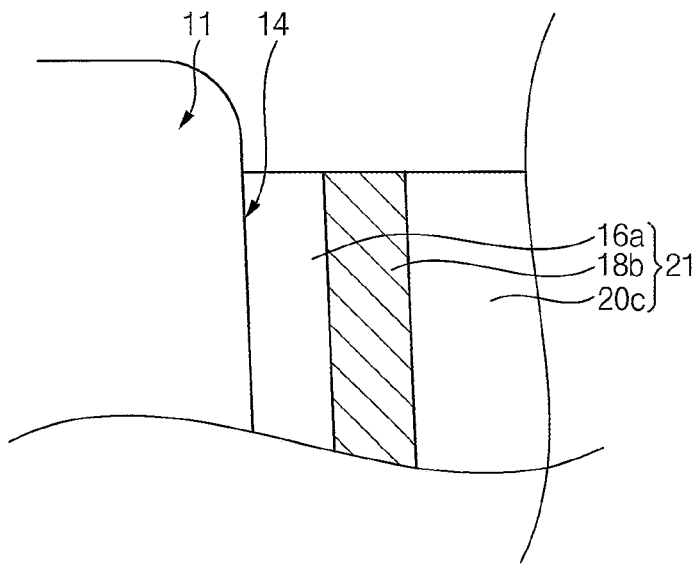

FIGS. 1 and 2 are cross-sectional views of a semiconductor device in accordance with example embodiments. FIG. 3 is a perspective view of a portion of a semiconductor device in accordance with example embodiments. FIG. 4 is a plan view of a semiconductor device in accordance with example embodiments. FIGS. 5A and 5B are cross-sectional views of a portion of an isolation structure of the semiconductor device in accordance with example embodiments.

FIG. 1 is a cross-sectional view taken along a line I-I' of FIG. 4, and FIG. 2 is a cross-sectional view taken along a line II-IF of FIG. 4. FIG. 3 is a perspective view of a portion A of FIG. 4.

Referring to FIGS. 1 to 4, a substrate 10 may be provided. The substrate 10 may be, e.g., a silicon single crystal substrate or a silicon on insulator (SOI) substrate. A trench 14 may be formed at or in an upper portion of the substrate 10. The trench 14 may serve as an isolation region of the substrate 10. A portion of the substrate 10 between the trenches 14 may be defined as an active pattern 11.

An isolation structure 21 including an inner wall oxide layer pattern 16a, a liner pattern 18b, and a filling insulation pattern 20c may fill the trench 14.

The inner wall oxide layer pattern 16a may be conformally on a surface of the trench 14, and the liner pattern 18b may be conformally on the inner wall oxide layer pattern 16a. The filling insulation pattern 20c may be on the liner pattern 18b to fill an inner space of the trench 14.

The inner wall oxide layer pattern 16a may include, e.g., silicon oxide. The liner pattern 18b may include, e.g., silicon nitride. The filling insulation pattern 20c may include, e.g., silicon oxide. In an implementation, the filling insulation pattern 20c may include Tonen Silazene (TOSZ).

In the isolation structure 21, the liner pattern 18b may not protrude from or above top surfaces of the inner wall oxide layer pattern 16a and the filling insulation pattern 20c (e.g., an uppermost part of the liner pattern 18b may be about the same height as uppermost parts of the inner wall oxide layer pattern 16a and the filling insulation pattern 20c, as measured in a vertical direction from a bottom of the trench). In an implementation, a boundary between top surfaces of the liner pattern 18b and the inner wall oxide layer pattern 16a may not have a step difference (e.g., may be flat, continuous, or coplanar), and may not have step shape. A boundary between the top surfaces of the liner pattern 18b and the filling insulation pattern 20c may not have a step difference and may not have step shape.

In an implementation, a dent may not be formed between the liner pattern 18b and a sidewall of the trench 14. In an implementation, in manufacturing processes for the semiconductor device, defects (e.g., bridge defect between neighboring gate electrodes) that could otherwise be caused by remaining conductive materials (e.g., gate electrode layers) in the dent may be decreased.

An upper surface of the isolation structure 21 may be lower than an upper surface of the active pattern 11. In an implementation, the top surfaces of the inner wall oxide layer pattern 16a, the liner pattern 18b, and the filling insulation pattern 20c may be lower than the upper surface of the active pattern 11.

The top surface of the inner wall oxide layer pattern 16a may be lower than the upper surface of a portion of the substrate 10 adjacent to the trench 14. In an implementation, the upper surface of the active pattern 11 and an upper sidewall of the trench 14 may be exposed (e.g., not covered) by the inner wall oxide layer pattern 16a.

In an implementation, the top surface of the inner wall oxide layer pattern 16a may be higher than the top surface of the liner pattern 18b, or the top surface of the inner wall oxide layer pattern 16a may have a height the same as a height of the top surface of the liner pattern 18b.

In an implementation, as shown in FIG. 5A, in the isolation structure 21, an upper surface of the inner wall oxide layer pattern 16a contacting on a sidewall of the trench 14 may be higher than an upper surface of the liner pattern 18b. In an implementation, each of the upper surfaces of the inner wall oxide layer pattern 16a and the liner pattern 18b contacting or proximate to the sidewall of the trench 14 may be highest (e.g., may be the highest portion of the respective pattern). As the upper surfaces of the inner wall oxide layer pattern 16a and the liner pattern 18b may be disposed far or increase in distance from the sidewall of the trench 14, the upper surfaces of the inner wall oxide layer pattern 16a and the liner pattern 18b may be gradually lowered so as to have a gentle (e.g., downward) inclination.

In an implementation, as shown in FIG. 5B, in the isolation structure 21, the upper surfaces of the inner wall oxide layer pattern 16a and the liner pattern 18b may be coplanar with each other. In an implementation, the upper surfaces of the inner wall oxide layer pattern 16a and the upper surface of the liner pattern 18b may be flat.

The upper surface of the active pattern 11 and the upper sidewall of the trench 14 exposed by the isolation structure 21 may serve as an active region of the substrate 10. A boundary portion (e.g., corner) between the upper surface of the active pattern 11 and the upper sidewall of the trench 14 may have a gently rounded shape. In an implementation, an edge portion of the active region may have a gently rounded shape.

A gate oxide layer pattern 30a may be on the upper surface of the active pattern 11 and the upper sidewall of the trench 14 exposed by the isolation structure 21. The gate oxide layer pattern 30a may include silicon oxide. The gate oxide layer pattern 30a may be further on the upper surface of the isolation structure 21 at a relatively thin thickness. In an implementation, the gate oxide layer pattern 30a on the upper surface of the active pattern and the upper sidewall of the trench 14 (e.g., higher than the top surface of the inner wall oxide layer pattern 16a) may have a first thickness. The gate oxide layer pattern 30a on the upper surface of the isolation structure 21 may have a second thickness that is less than the first thickness. In an implementation, the gate oxide layer pattern 30a on the upper surface of the isolation structure 21 may not actually operate as a gate insulation layer of a transistor.

A gate electrode 32a and a capping layer pattern 34a may be stacked on the gate oxide layer pattern 30a. The gate oxide layer pattern 30a, the gate electrode 32a, and the capping layer pattern 34a may serve as a gate structure 40. The gate structure 40 may extend (e.g., lengthwise) in a first (e.g., horizontal) direction so as to cross the active pattern 11.

The gate electrode 32a may include a metal or polysilicon doped with impurities. In an implementation, the gate electrode may have a structure in which a polysilicon pattern doped with impurities and a metal pattern are stacked.

The capping layer pattern 34a may include, e.g., silicon nitride.

A spacer 36 may be on sidewalls of the gate structure 40. Impurity regions 38 may be at or in the substrate 10 adjacent to both sides of the gate structure 40. The spacer 36 may include, e.g., silicon oxide or silicon nitride. As used herein, the term "or" is not an exclusive term, e.g., "A or B" would include A, B, or A and B.

The semiconductor device may not include a dent of the isolation structure. In an implementation, bridge defects, which could otherwise be caused by remaining conductive materials (e.g., gate electrode materials) in the dent of the isolation structure, may be decreased.

FIGS. 6 to 14 are cross-sectional views of stages in a method of manufacturing a semiconductor device in accordance with example embodiments.

Figure 6:
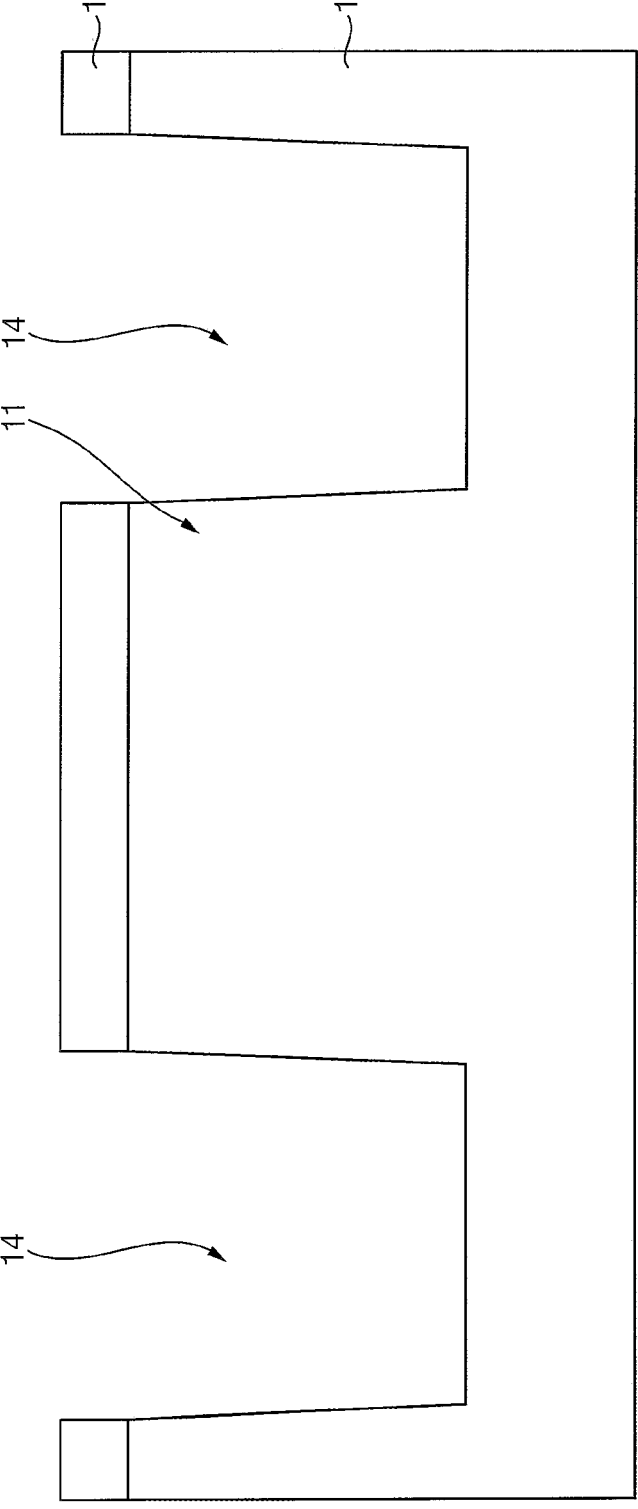

Referring to FIG. 6, a first hard mask pattern 12 (serving as a mask for forming a trench) may be formed on a substrate 10. In an implementation, the first hard mask pattern 12 may include, e.g., silicon oxide or silicon nitride.

An upper portion of the substrate 10 may be etched using the first hard mask pattern 12 as an etch mask to form a trench 14. An upper surface portion of the substrate 10 between the trenches 14 may serve as an active pattern 11. Thereafter, the first hard mask pattern 12 may be removed.

Figure 7:
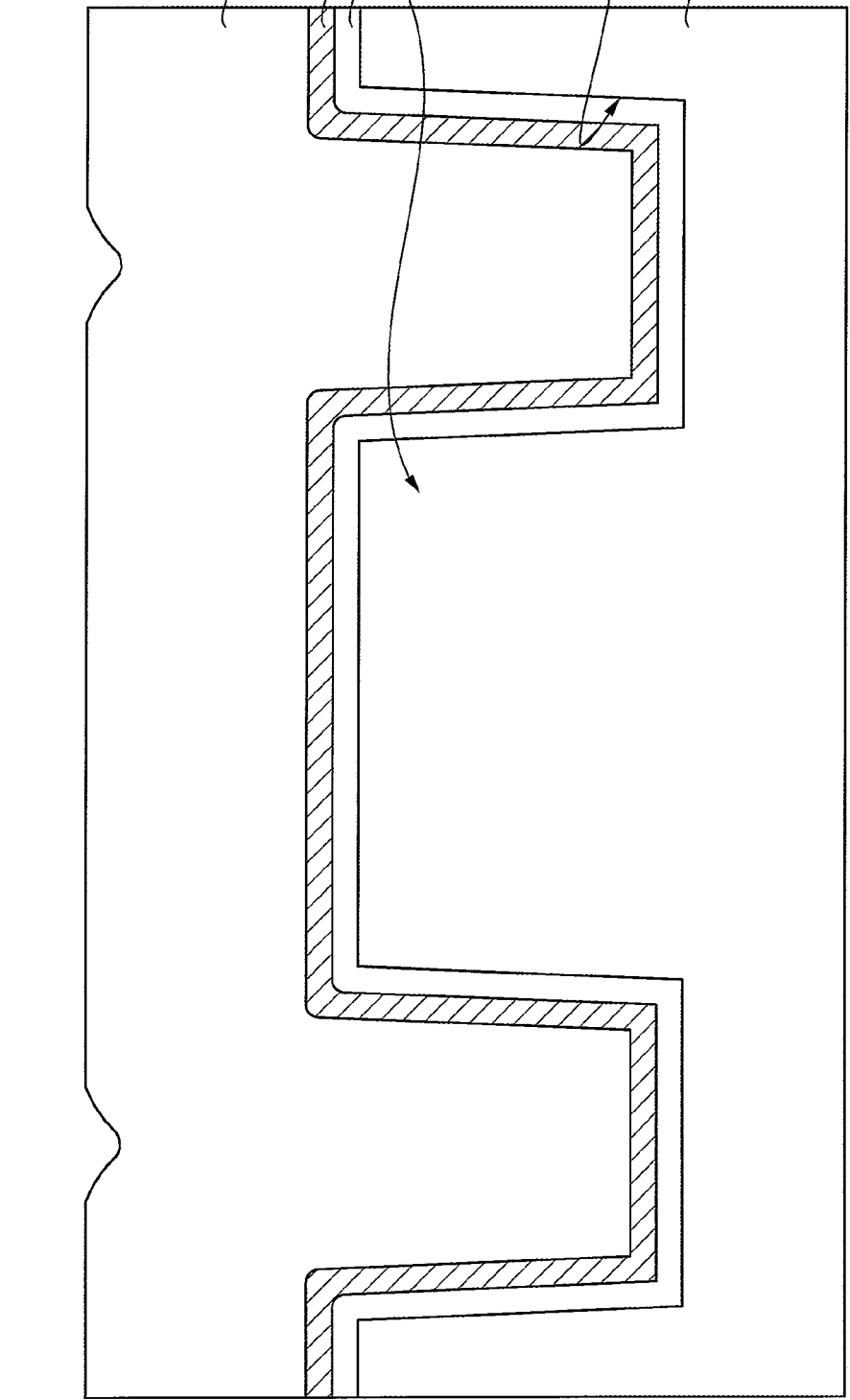

Referring to FIG. 7, an inner wall oxide layer 16 may be conformally formed on an upper surface of the substrate 10 and the surface of the trench 14. A liner layer 18 may be conformally formed on the inner wall oxide layer 16.

In an implementation, the inner wall oxide layer 16 may include silicon oxide. The inner wall oxide layer 16 may be formed by a thermal oxidation process or a deposition process. In an implementation, the liner layer 18 may include silicon nitride. The liner layer 18 may be formed by a deposition process.

A filling insulation layer 20 may be formed on the liner layer 18 to fill the trench 14. The filling insulation layer 20 may include silicon oxide. In an implementation, the filling insulation layer 20 may include a TOSZ material having excellent gap filling characteristic.

Figure 8:
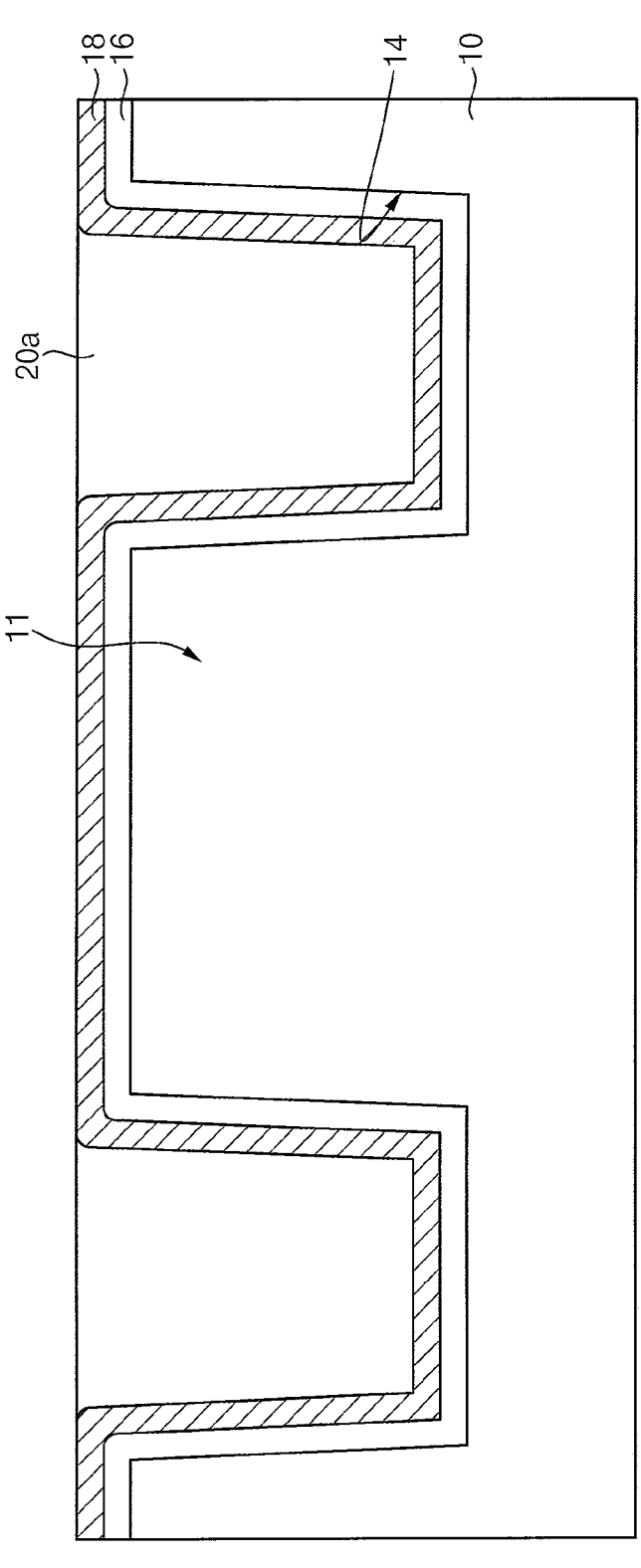

Referring to FIG. 8, the filling insulation layer 20 may be planarized to expose the liner layer 18 on the substrate 10. The planarization process may include a chemical mechanical polishing (CMP) process. Thus, a first preliminary filling insulation pattern 20a may be formed in the trench 14.

Figure 9:
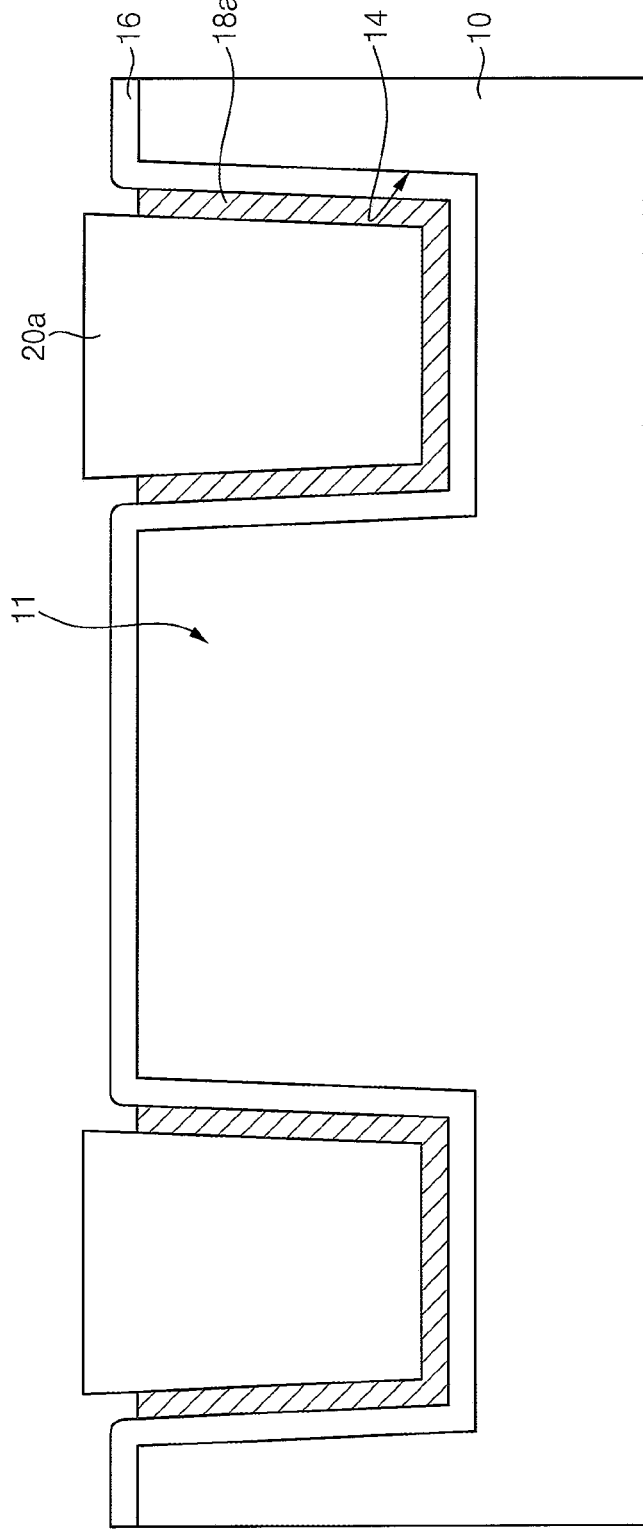

Referring to FIG. 9, an exposed portion of the liner layer 18 may be removed so as to remove the liner layer 18 from the upper surface of the substrate 10. The removing process may include a wet etching process.

In the removing process, the liner layer 18 along the upper sidewall of the trench 14 in a vertical direction may also be partially removed. Thus, the liner layer 18 may be transformed as a preliminary liner pattern 18a having a roughly U-shape in a cross-sectional view.

Figure 10:
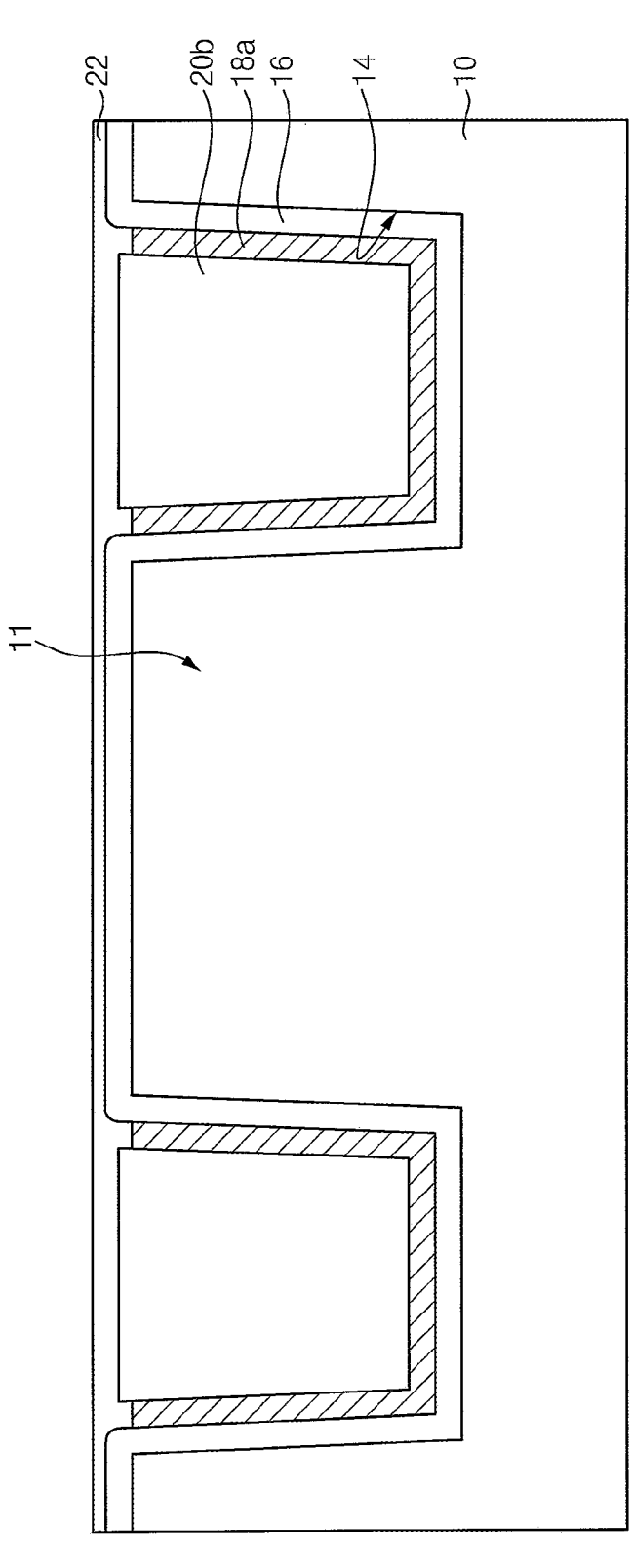

Referring to FIG. 10, an upper portion of the first preliminary filling insulation pattern 20a may be partially removed so that a height of an upper surface of the first preliminary filling insulation pattern 20a is lowered. Thus, a second preliminary filling insulation pattern 20b may be formed. The removing process may include a wet etching process. In the partially removing process of the first preliminary filling insulation pattern 20a, the inner wall oxide layer 16 may be hardly removed, or a portion of the inner wall oxide layer 16 may be partially removed by a thickness less than a removing thickness of the first preliminary filling insulation pattern 20a.

Thereafter, a protective oxide layer 22 may be further formed to cover the inner wall oxide layer 16, the preliminary liner pattern 18a, and the second preliminary filling insulation pattern 20b.

Figure 11:
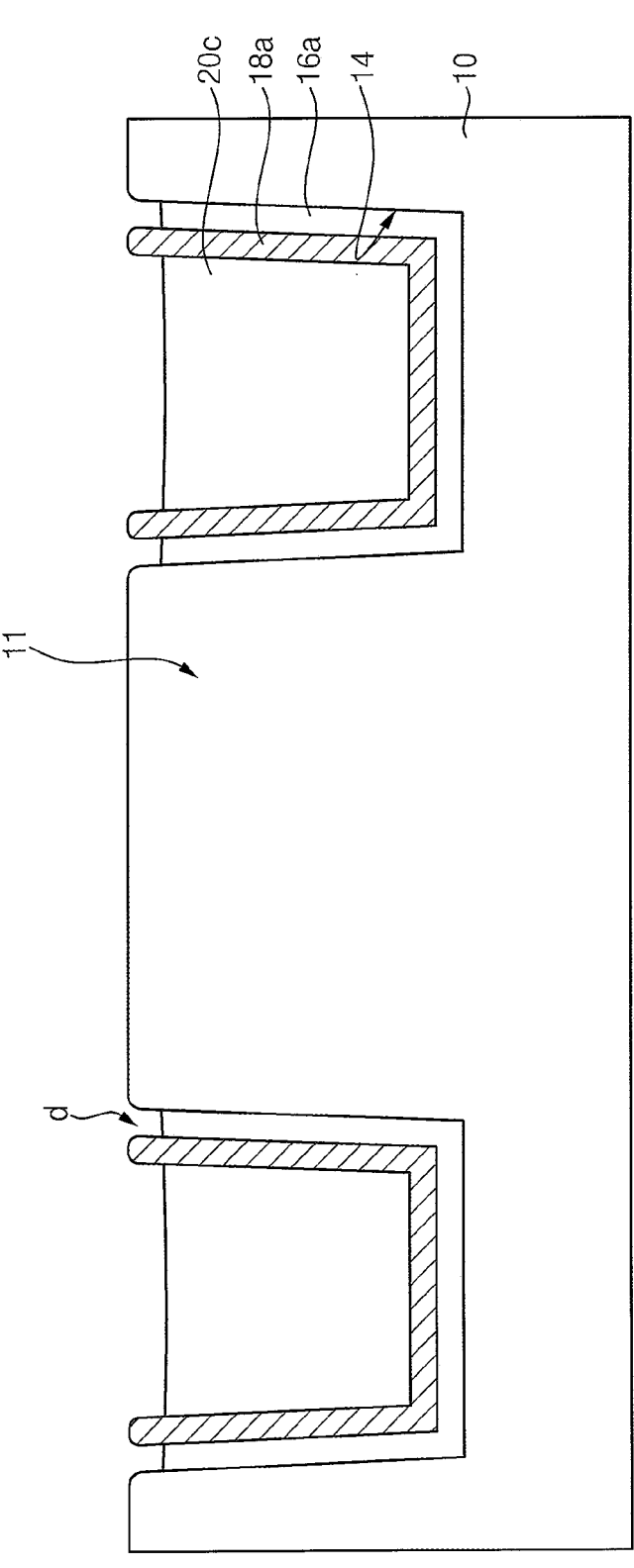

Referring to FIG. 11, the protective oxide layer 22 and the inner wall oxide layer 16 may be partially removed so that the upper surface of the substrate 10 and the upper sidewall of the trench 14 are exposed. Exposed portions of upper surface of the active pattern 11 and the upper sidewall of the trench 14 may serve as an active region. In an implementation, the active region may include the surface of the active pattern 11 and the upper sidewall of the trench 14 extended from the surface of the active pattern 11. The removing process may include a wet etching process.

In the removing process, an upper portion of the second preliminary filling insulation pattern 20b in the trench 14 may also be removed. Thus, an inner wall oxide layer pattern 16a and a filling insulation pattern 20c may be formed in the trench 14. Upper surfaces of the inner wall oxide layer pattern 16a and the filling insulation pattern 20c may be lower (e.g., closer to the bottom of the trench 14 in a vertical direction) than the upper surface of the active pattern 11.

In the removing process, the preliminary liner pattern 18a may not be removed. Therefore, the preliminary liner pattern 18a may protrude from upper surfaces of the inner wall oxide layer pattern 16a and the filling insulation pattern 20c. The preliminary liner pattern 18a may be positioned between the inner wall oxide layer pattern 16a and the filling insulation pattern 20c. Thus, a dent d may be formed between the preliminary liner pattern 18a and a sidewall of the trench 14. The upper surface of the inner wall oxide layer pattern 16a may be lower than an upper surface of the preliminary liner pattern 18a. The upper surface of the filling insulation pattern 20c may be lower than an upper surface of the preliminary liner pattern 18a.

Figure 12:
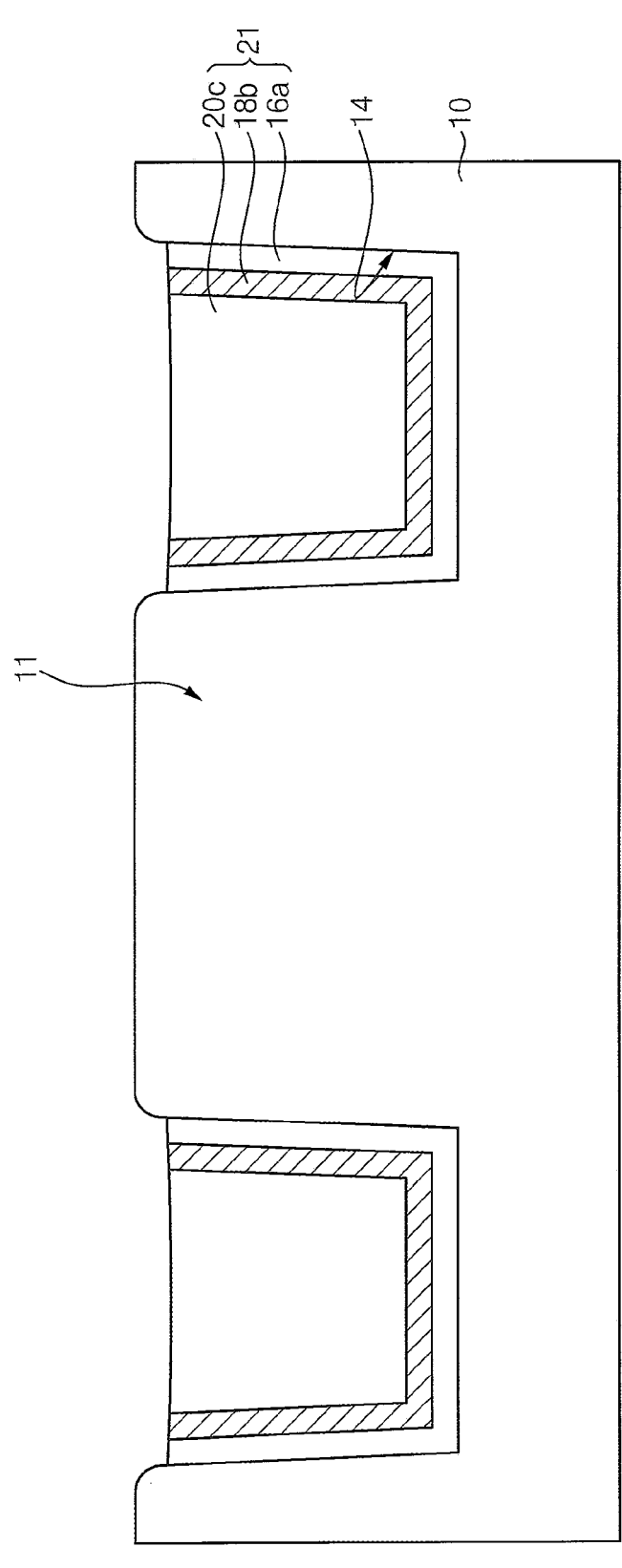

Referring to FIG. 12, a protruding portion of the preliminary liner pattern 18a may be removed to form a liner pattern 18b. The removing process may be performed by a wet etching process and a cleaning process.

The preliminary liner pattern 18a may be etched using phosphoric acid. After the wet etching process, the cleaning process may be performed using a SC1 solution, which is a mixed solution of aqueous ammonia, hydrogen peroxide, and deionized water.

When the preliminary liner pattern 18a is removed by the etchant while the upper surface of the substrate 10 and the upper sidewall of the trench 14 are exposed, a boundary portion between the upper surface of the substrate 10 and the upper sidewall the trench 14 may be partially etched to have a gently rounded shape. In an implementation, a radius of curvature of a boundary portion between the upper surface of the active pattern 11 and the upper sidewall of the trench 14 may increase. As such, an edge of the active region may have a rounded shape. The edge of the active region may not have a sharp shape, so that a concentration of electric fields may be decreased at the edge of the active region.

An upper surface of the liner pattern 18b may be lower than an upper surface of the active pattern 11. The upper surface of the liner pattern 18b may not have a portion protruding from or above the upper surfaces of the inner wall oxide layer pattern 16a and the filling insulation pattern 20c. A boundary between top surfaces of the liner pattern 18b and the inner wall oxide layer pattern 16a may not have a step difference, and a boundary between top surfaces of the liner pattern 18b and the filling insulation pattern 20c may not have a step difference (e.g., the top surfaces may together form a smooth, continuous surface). In an implementation, the dent between the liner pattern 18b and the sidewall of the trench 14 may be removed.

The inner wall oxide layer pattern 16a, the liner pattern 18b, and the filling insulation pattern 20c in the trench 14 may serve as an isolation structure 21. An upper surface of the isolation structure 21 may be lower (e.g., closer to the bottom of the trench in the vertical direction) than the upper surface of the active pattern 11.

As an etching deviation according to etching positions may occur in the etching processes, the upper surface of the inner wall oxide layer pattern 16a at the portion in contact with the sidewall of the trench 14 may be higher than the upper surface of the liner pattern 18b. In an implementation, the upper surface of the inner wall oxide layer pattern 16a and the upper surface of the liner pattern 18b may have a gentle (e.g., downward) slope from the upper sidewall of the trench 14.

In an implementation, in the isolation structure 21, the upper surface of the inner wall oxide layer pattern 16a and the upper surface of the liner pattern 18b adjacent to the sidewall of the trench 14 may be substantially coplanar with each other. In an implementation, the upper surface of the inner wall oxide layer pattern 16a and the upper surface of the liner pattern 18b may be flat.

Figure 13:
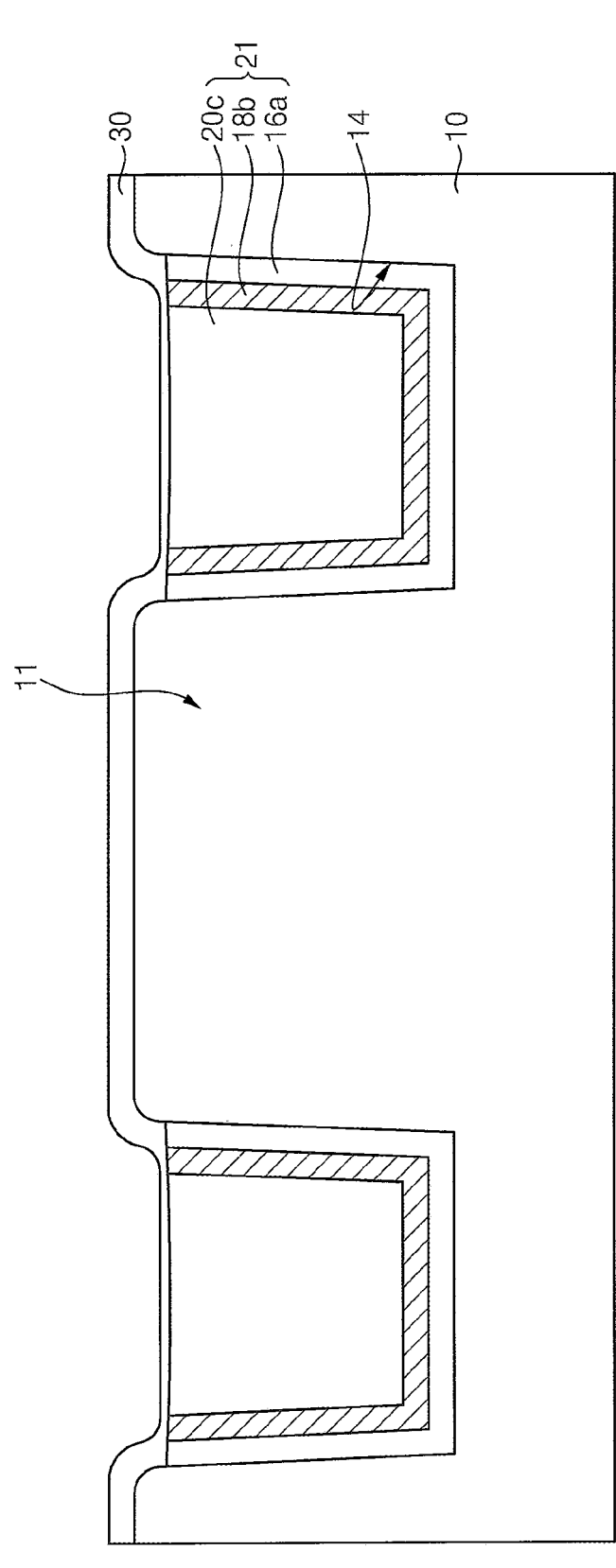

Referring to FIG. 13, a gate oxide layer 30 may be formed on exposed portions of the upper surface of the active pattern 11 and the upper sidewall of the trench 14. The gate oxide layer 30 may be formed by a thermal oxidation process. The gate oxide layer 30 may be or include silicon oxide. When the thermal oxidation process is performed, the gate oxide layer 30 may be also formed on the upper surface of the isolation structure 21 to have a relatively thin thickness. The gate oxide layer 30 on the upper surface of the isolation structure 21 may not actually operate or serve as a gate oxide layer of a transistor.

As not only the upper surface of the active pattern 11 but also the upper sidewall of the trench 14 may be exposed before the thermal oxidation process, a region or area for forming the gate oxide layer 30 of the transistor may increase.

Figure 14:
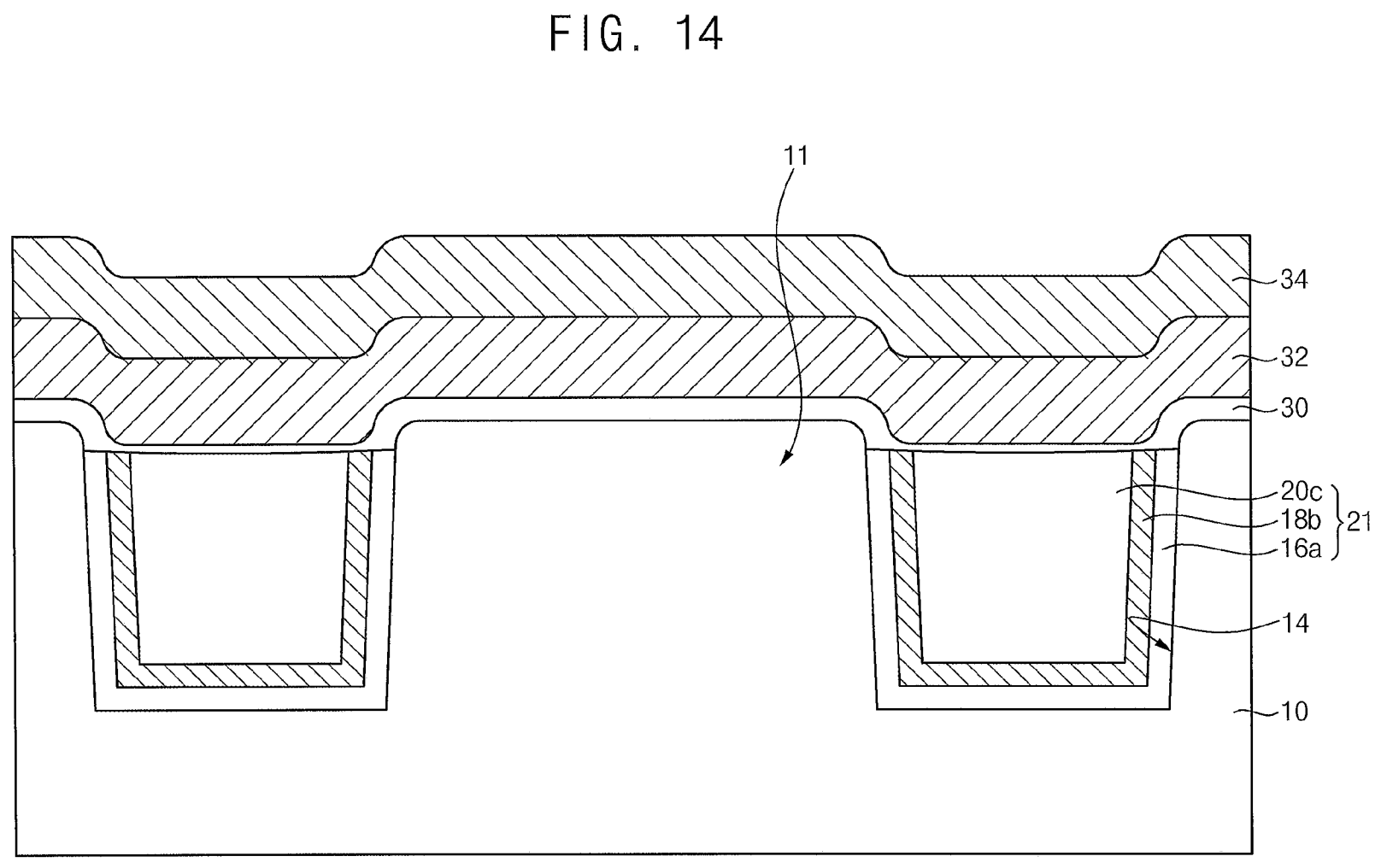

Referring to FIG. 14, a gate electrode layer 32 may be formed on the gate oxide layer 30. The gate electrode layer 32 may include a metal or polysilicon doped with impurities.

A capping layer 34 may be formed on the gate electrode layer 32. The capping layer 34 may include silicon nitride.

Referring to FIGS. 1 to 4 again, the capping layer 34 may be patterned to form a capping layer pattern 34a.

The gate electrode layer 32 and the gate oxide layer 30 may be etched using the capping layer pattern 34a as an etch mask to form a gate structure on the substrate 10. The etching process may include an anisotropic etching process.

The gate structure 40 may include the gate oxide layer pattern 30a, the gate electrode 32a, and the capping layer pattern 34a, sequentially stacked. A spacer 36 may be formed on sidewalls of the gate structure 40. Impurities may be doped into the upper portion of the substrate 10 adjacent to both sides of the gate structure 40 to form impurity regions 38.

A dent having a narrow width may not be formed between the liner pattern 18b and the sidewall of the trench 14, so that the gate electrode layer 32 may not fill the (nonexistent) dent. Thus, an etching gas may be sufficiently introduced in the etching process of the gate electrode layer 32, so that the gate electrode layer may not remain between the gate structures 40 after the etching process of the gate electrode layer 32. Accordingly, a bridge defect between the gate electrodes 32a caused by remaining gate electrode layer between the gate electrodes 32a may be decreased or prevented.

Figure 15:
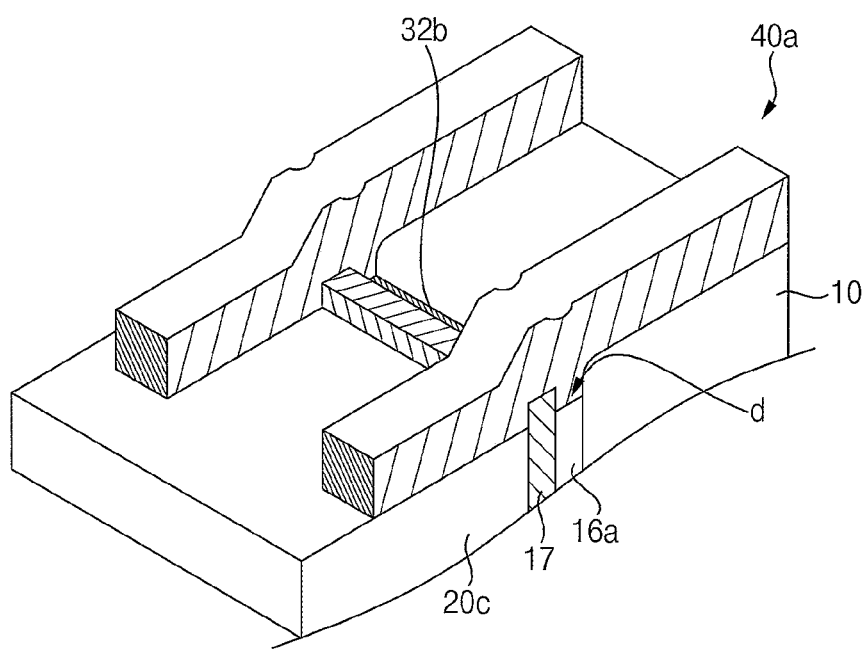
FIG. 15 is a perspective view of a gate structure and an isolation structure having a dent.

FIG. 15 is a perspective view of a gate structure and an isolation structure having a dent.

FIG. 15 is presented for comparison with the example embodiments.

As shown in FIG. 15, when a dent d having a narrow width is between the liner pattern 17 and the sidewall of the trench in the isolation structure, a gate electrode layer may fill the dent d. Thus, a vertical thickness of the gate electrode layer filling the dent d may be relatively thicker than the vertical thickness of the gate electrode layer formed on other portions. Further, in an etching process, it may not be easy for an etching gas to flow into or onto the gate electrode layer filling the dent d. Therefore, after the etching process of the gate electrode layer for forming the gate electrode, an unetched gate electrode layer 32b could remain in the dent d between the gate structures 40a. Therefore, a bridge defect between neighboring gate electrodes could occur due to the remaining gate electrode layer 32b between the gate electrodes.

However, in accordance with example embodiments, the dent may not be formed or remain between the liner pattern 17 and the sidewall of the trench 14, and the possibility of a bridge defect between the gate electrodes 32a caused by the remaining gate electrode layer may be decreased or prevented. Thus, a semiconductor device having high reliability may be manufactured by the above processes.

Figure 16:
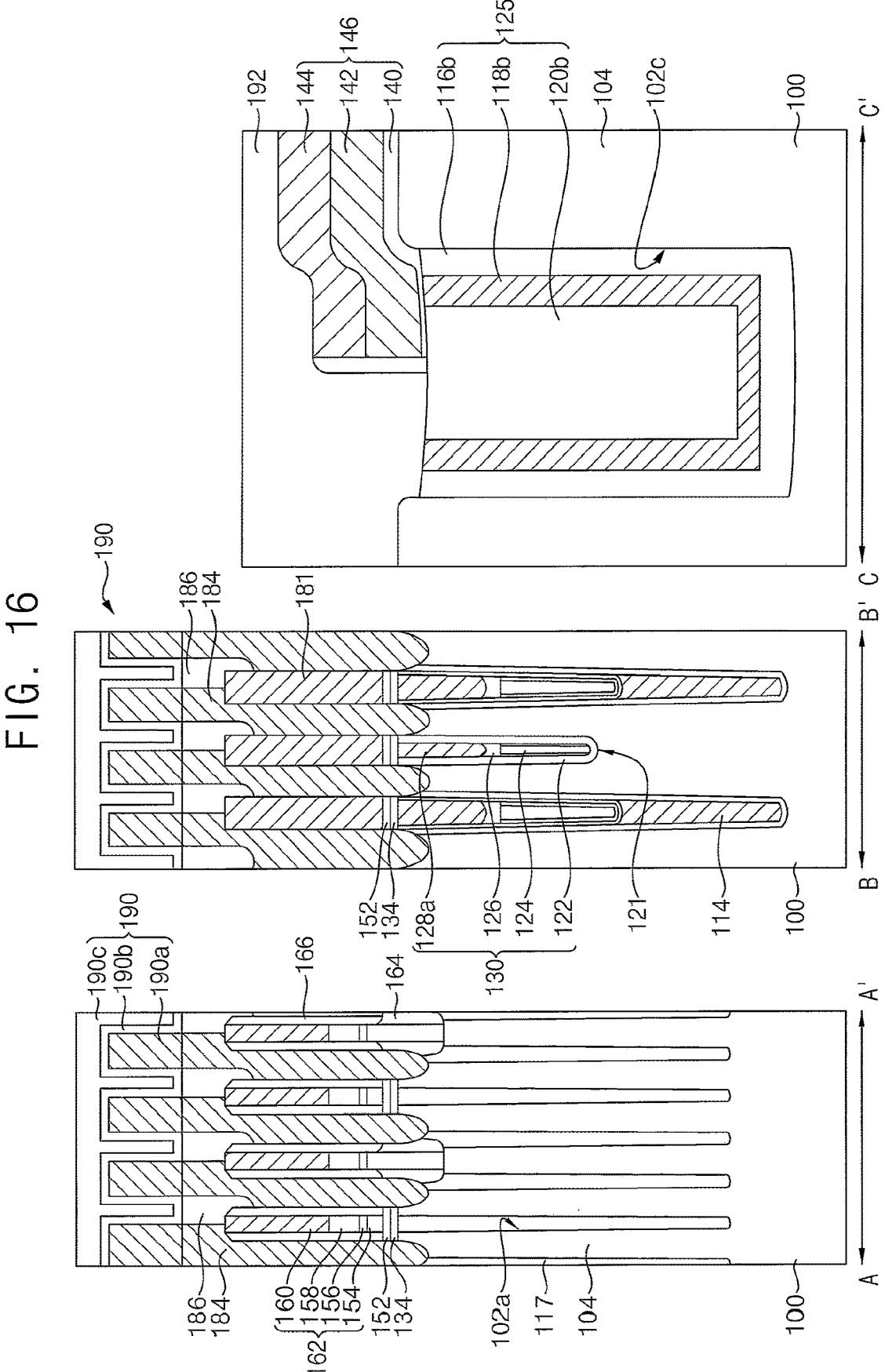
Figure 17:
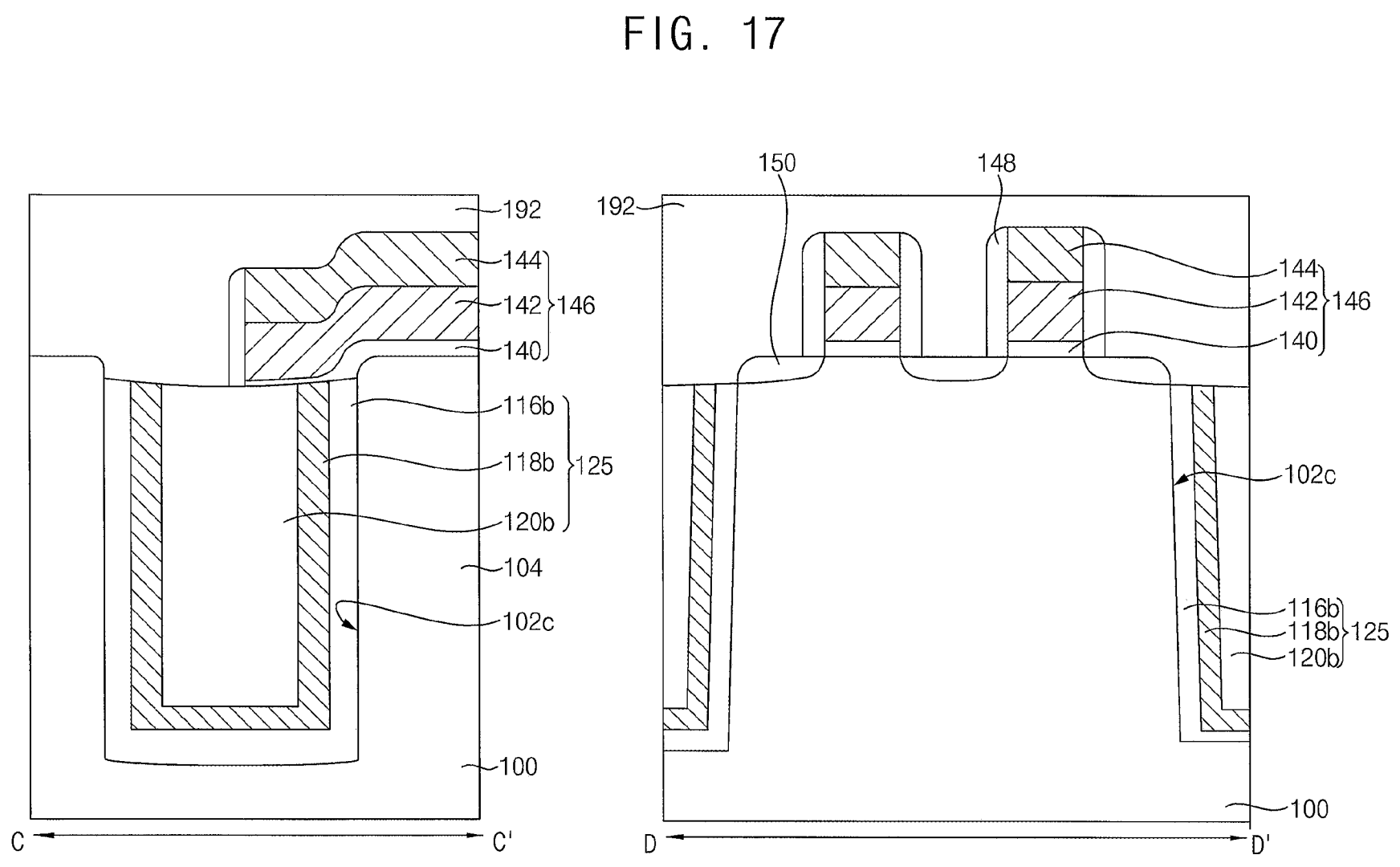
Figure 18:
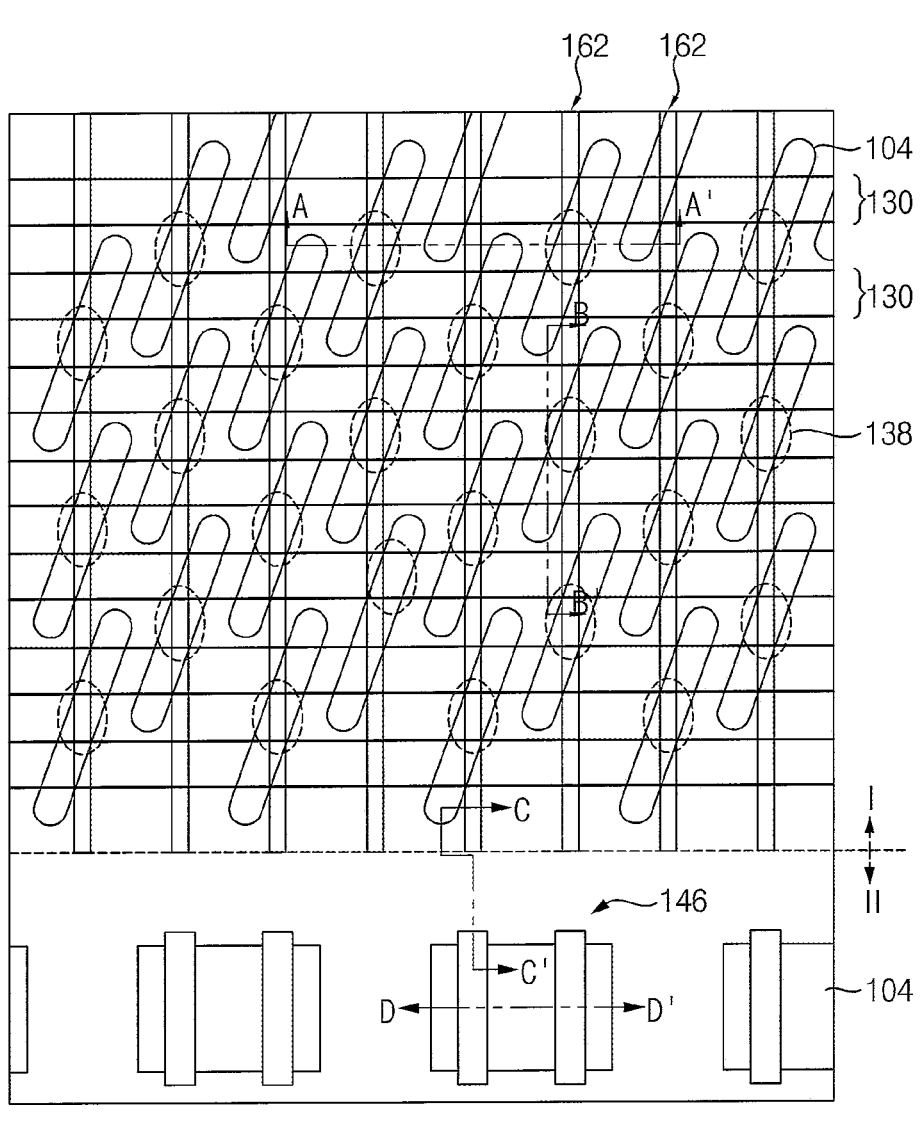
FIG. 18 is a plan view of a DRAM device in accordance with example embodiments.
Figure 18:
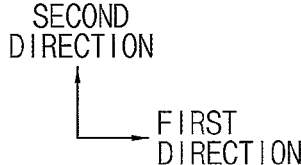

FIGS. 16 and 17 are cross-sectional views of DRAM devices in accordance with example embodiments. FIG. 18 is a plan view of a DRAM device in accordance with example embodiments.

In FIG. 18, contact plugs and capacitors are not shown in order to simplify the drawing. FIG. 16 includes cross-sectional views taken along lines A-A' and B-B' of FIG. 18, and FIG. 17 includes cross-sectional views taken along lines C-C' and D-D' of FIG. 18.

Referring to FIGS. 16 to 18, the DRAM device may be formed on a substrate 100 including a first region I and a second region II. The first region I may be a cell region on which memory cells may be formed, and the second region II may be a core/peripheral region on which peripheral circuits or core circuits may be formed.

Trenches 102a, 102b, and 102c may be formed at or in the substrate 100. A portion of the substrate between the trenches 102a, 102b, and 102c may be referred to as an active pattern 104.

For convenience of description, the trench shown in the cross-sectional view taken along a line A-A' is referred to as a first trench 102a, and the trench shown in cross-sectional views taken along a line B-B' is referred to as a second trench 102b. In addition, each of the trenches shown in the cross-sectional views taken along lines C-C' and D-D' are referred to as a third trench 102c. The first trench 102a and the second trench 102b may be formed in the first region I of the substrate 100, and the third trench 102c may be formed in the second region II of the substrate 100.

In the cross-sectional views, inner widths of the trenches 102a, 102b, and 102c may be changed by spacing between the active patterns 104. In the cross-sectional views, the first trench 102a may have a first inner width, and the second trench 102b may have a second inner width greater than the first inner width. The third trench 102c may have a third inner width greater than each of the first and second inner widths.

A first insulation layer pattern 117 may fill the first trench 102a in the first region I of the substrate 100. The first insulation layer pattern 117 may include silicon oxide. The first insulation layer pattern 117 filling the first trench 102a may be referred to as a first cell isolation structure.

The first insulation layer pattern 117 and a second insulation layer pattern 114 may fill the second trench 102b in the first region I of the substrate. The second insulation layer pattern 114 may include silicon nitride. The first insulation layer pattern 117 and the second insulation layer pattern 114 filling the second trench 102b may be referred to as a second cell isolation structure.

An inner wall oxide layer pattern 116b, a liner pattern 118b, and a filling insulation pattern 120b may be formed to fill the third trench 102c in the second region II of the substrate 100.

The liner pattern 118b may include silicon nitride. The inner wall oxide layer pattern 116b and the filling insulation pattern 120b may include silicon oxide. The inner wall oxide layer pattern 116b, the liner pattern 118b, and the filling insulation pattern 120b filling the third trench 102c may serve as an isolation structure 125.

In the isolation structure 125, the liner pattern 118b may not protrude from upper surfaces of the inner wall oxide layer pattern 116b and the filling insulation pattern 120b. A boundary between top surfaces of the liner pattern 118b and the inner wall oxide layer pattern 116b may not have a step difference (e.g., may be continuous or smooth). A boundary between top surfaces of the liner pattern 118b and the filling insulation pattern 120b may not have a step difference. As such, a dent may not be formed between the liner pattern 118b and a sidewall of the third trench 102c.

An upper surface of the isolation structure 125 may be lower than an upper surface of the second region II of the substrate 100 (e.g., a surface of the active pattern). Thus, an upper surface of the active pattern 104 and an upper sidewall of the third trench 102*c* of the second region II may be exposed by the inner wall oxide layer pattern 116*b*.

In the second region II, a boundary portion of the upper surface of the active pattern 104 and the upper sidewall of the third trench 102*c* exposed by the isolation structure 125 may have a gently rounded shape.

A second gate oxide layer pattern 140 may be formed on the upper surface of the active pattern 104 and the upper sidewall of the third trench 102*c* of the second region II. A second gate electrode 142 and a second capping layer pattern 144 may be stacked on the second gate oxide layer pattern 140. The second gate oxide layer pattern 140, the second gate electrode 142, and the second capping layer pattern 144 may serve as a second gate structure 146. The second gate structure 146 may extend so as to cross the active pattern 104.

A first spacer 148 may be on a sidewall of the second gate structure 146. Impurity regions 150 doped with impurities may be at or in the substrate 10 adjacent to both sides of the second gate structure 146. A transistor on the second region II of the substrate 100 may be substantially the same as the transistor described with reference to FIGS. 1 to 4.

A mask insulation pattern 192 may be on the second region II of the substrate to cover the second gate structure 146.

A DRAM cell may be on the first region I of the substrate. In an implementation, a DRAM cell may be on the first region I of the substrate.

A gate trench 121 extending in a first direction may be on or in the first region I of the substrate, and a first gate structure 130 may be in the gate trench 121. A portion of the first gate structure 130 may be on the second insulation layer pattern 114.

The first gate structure 130 may include a first gate insulation layer 122, a first gate electrode 124, a polysilicon pattern 126, and a first capping layer pattern 128*a*.

A protective oxide layer 134 and an etch stop layer 152 may be on the first region I of the substrate 100. In an implementation, the protective oxide layer 134 may include silicon oxide, and the etch stop layer 152 may include silicon nitride.

A bit line structure 162 may be on the first region I of the substrate 100. The bit line structure 162 may contact the active pattern 104 and the etch stop layer 152. The bit line structure 162 may include a first conductive pattern 154, a barrier pattern 156, a first metal pattern 158, and a third capping layer pattern 160 sequentially stacked.

The bit line structure 162 may be on a first opening 138 at the substrate 100, and may contact the active pattern 104 exposed by the first opening 138. Thus, a portion of the active pattern 104 contacting the bit line structure 162 may be recessed.

A lower insulation pattern 164 may fill a gap between a lower sidewall of the bit line structure 162 and the first opening 138. In addition, a second spacer 166 may be on a sidewall of the bit line structure 162. In an implementation, as shown in FIG. 16, the second spacer 166 may include one spacer. In an implementation, the second spacer 166 may be a spacer structure in which a plurality of spacers are stacked.

A fence insulation pattern 181 having a pillar shape may be between the bit line structures 162. The fence insulation pattern 181 may include silicon nitride. A contact hole may be defined by the bit line structure 162 and the fence insulation pattern 181. The active pattern 104 between the bit line structures 162 may be exposed on a lower surface of the contact hole.

A contact plug 184 may be in the contact hole, and the contact plug 184 may contact the active pattern exposed by the lower surface of the contact hole. The contact plug 184 may have an upper surface higher than an upper surface of the bit line structure 162. An upper insulation pattern 186 may fill a gap between contact plugs 184.

A capacitor 190 may contact the upper surface of the contact plug 184.

A dent may not be included in the isolation structure for forming the transistor serving as the core peripheral circuit of the DRAM device, a bridge defect between the gate electrodes of the transistor may be decreased, and a concentration of electric fields at an edge portion of the active region may be reduced.

FIGS. 19 to 35 are cross-sectional views and plan views of stages in a method of manufacturing a DRAM device in accordance with example embodiments.

Figure 19:
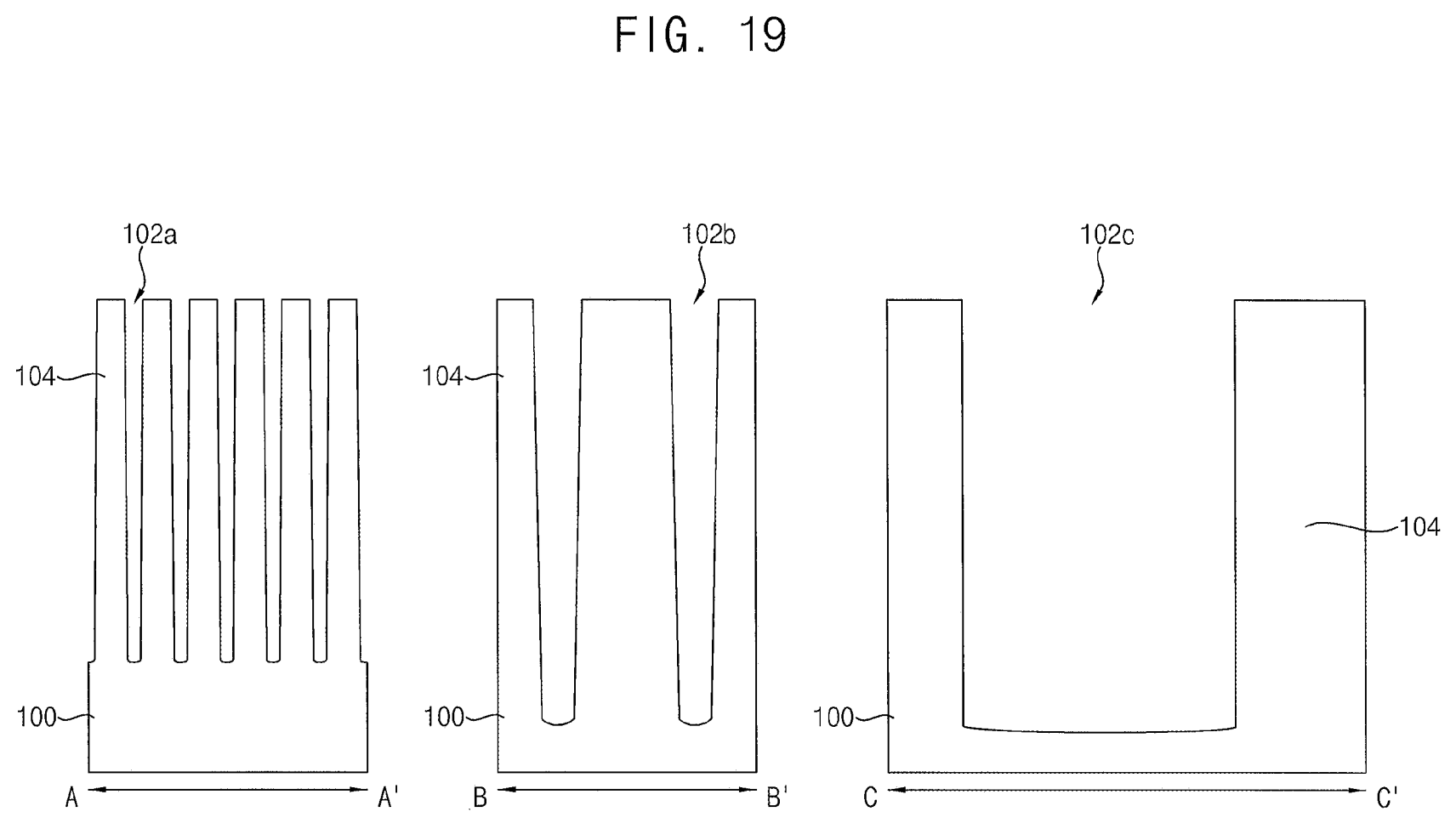
Figure 20:
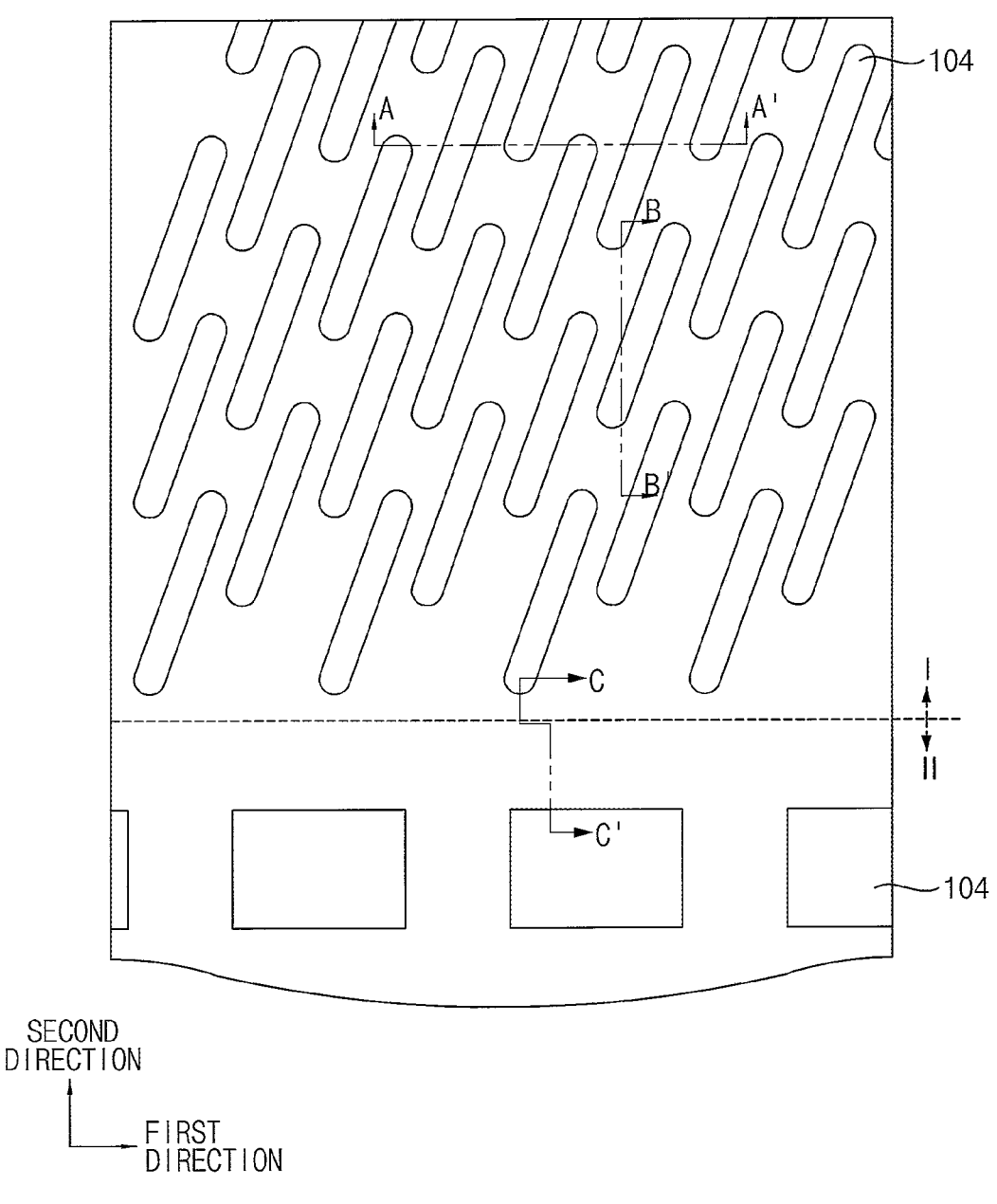

Referring to FIGS. 19 and 20, a substrate 100 may include a first region I and a second region II. The first region I may be a cell region on which memory cells may be (later) formed, and the second region II may be a core/peripheral region on which peripheral circuits or core circuits may be (later) formed.

A first mask pattern may be formed on the substrate 100, and the substrate 100 may be etched using the first mask pattern to form trenches 102*a*, 102*b*, and 102*c* in the isolation region. Active patterns 104 may be defined by the substrate between the trenches. The active patterns 104 formed in the first and second regions I and II may have different shapes, respectively.

A first trench 102*a* and a second trench 102*b* may be formed in the first region I of the substrate 100, and a third trench 102*c* may be formed in the second region II of the substrate 100.

Figure 21:
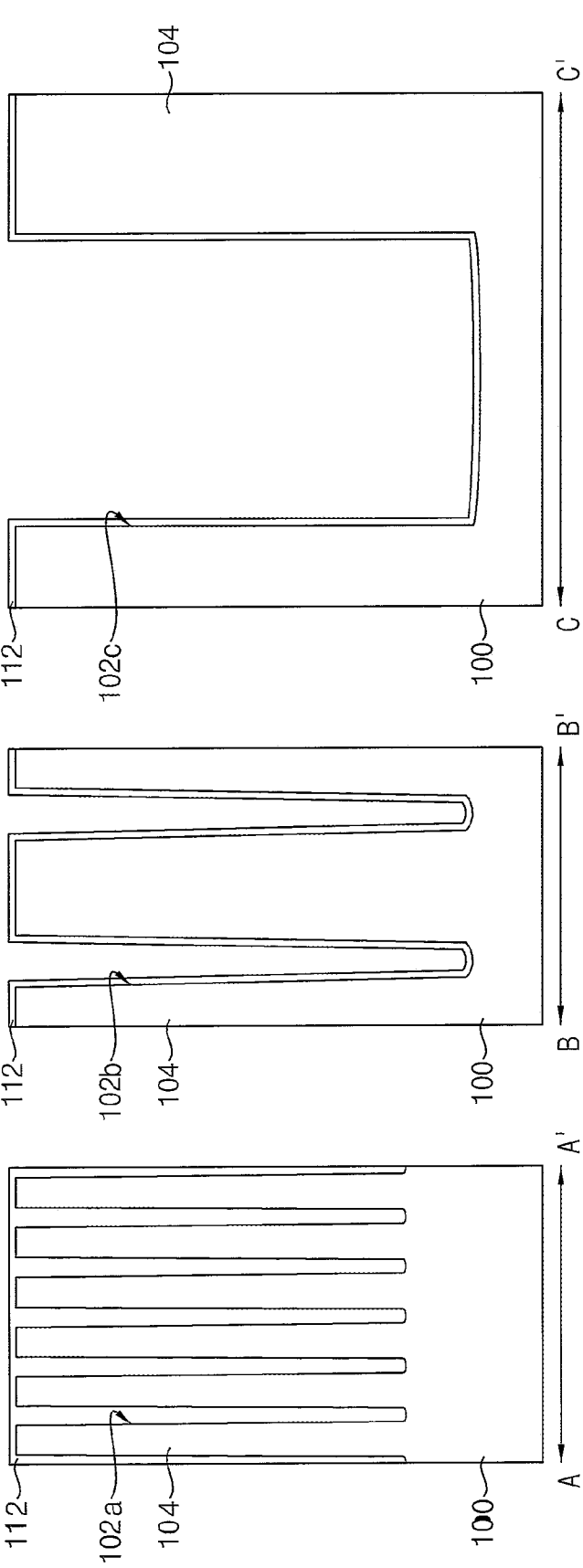

Referring to FIG. 21, a polysilicon layer may be conformally formed on inner surfaces of the first to third trenches 102*a*, 102*b*, and 102*c* and the upper surface of the substrate 100, and the polysilicon layer may be thermally oxidized to form a first oxide layer.

A first insulation layer 112 may be formed on the first oxide layer. The first insulation layer 112 may completely fill in the first trench 102*a*. The first insulation layer 112 may not completely fill the second and third trenches 102*b* and 102*c*, which have a width greater than that of the first trench 102*a*. In an implementation, the first insulation layer 112 may be conformally formed along the surfaces of the second and third trenches 102*b* and 102*c* and the upper surface of the substrate 100.

The first insulation layer 112 may include, e.g., silicon oxide, silicon nitride, or the like. These may be formed alone or may be stacked two or more. In an implementation, the first insulation layer 112 may include silicon oxide. In this case, the first insulation layer 112 may include the same material as the first oxide layer, so that the first insulation layer 112 and the first oxide layer may be merged with each other.

Figure 22:
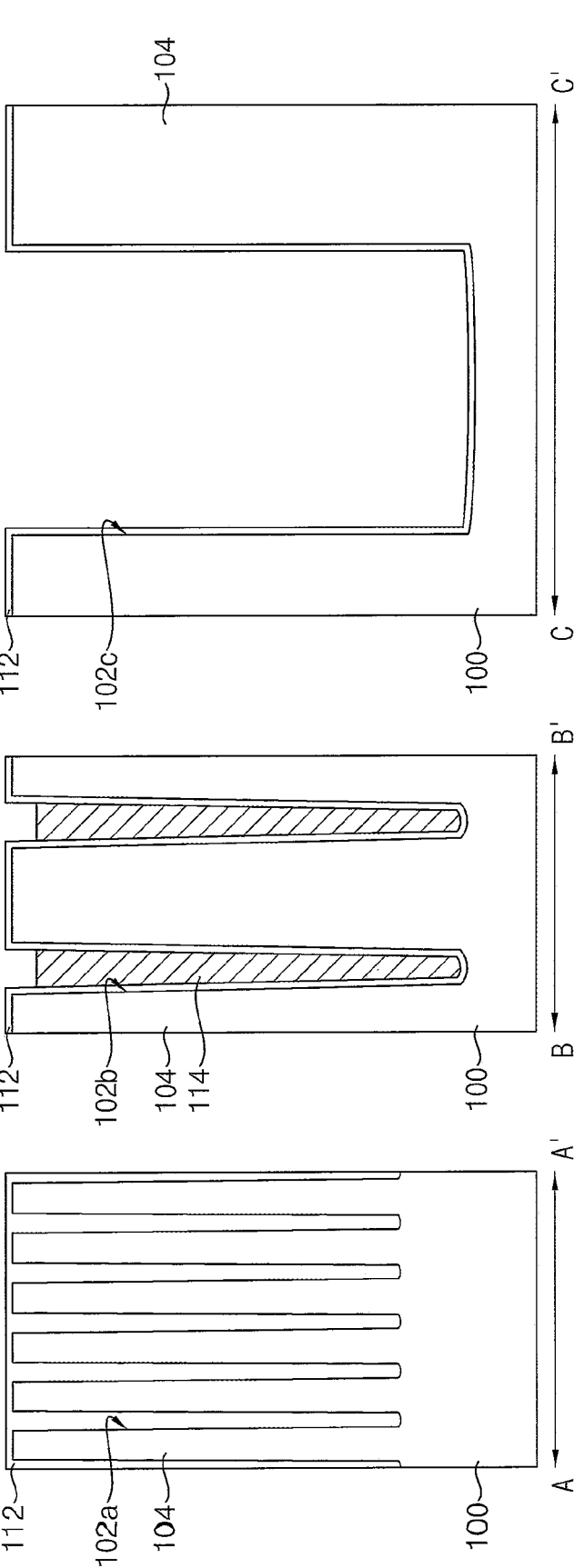

Referring to FIG. 22, a second insulation layer may be conformally formed on the first insulation layer 112. The second insulation layer may include a material different from that of the first insulation layer 112. The second insulation layer may completely fill the second trench 102*b*. The second insulation layer may not completely fill the third trench 102*c*. The second insulation layer may be conformally formed along the surface of the third trench 102*c*. In an implementation, the second insulation layer may include silicon nitride.

Then, the second insulation layer may be partially removed, e.g., by a partial thickness. The removing process may include an isotropic etching process or a cleaning process.

The second insulation layer formed in the second trench 102b may have relatively thick thickness in the vertical direction. Therefore, all of the second insulation layer may be removed by the etching process, except for the second insulation layer in the second trench 102b. Thus, a second insulation layer pattern 114 may be formed (e.g., may remain) in the second trench 102b.

Through the above process, an insulation material may be mostly filled in the first trench 102a and the second trench 102b of the first region. Meanwhile, the insulation material may not be filled in the third trench 102c.

Figure 23:
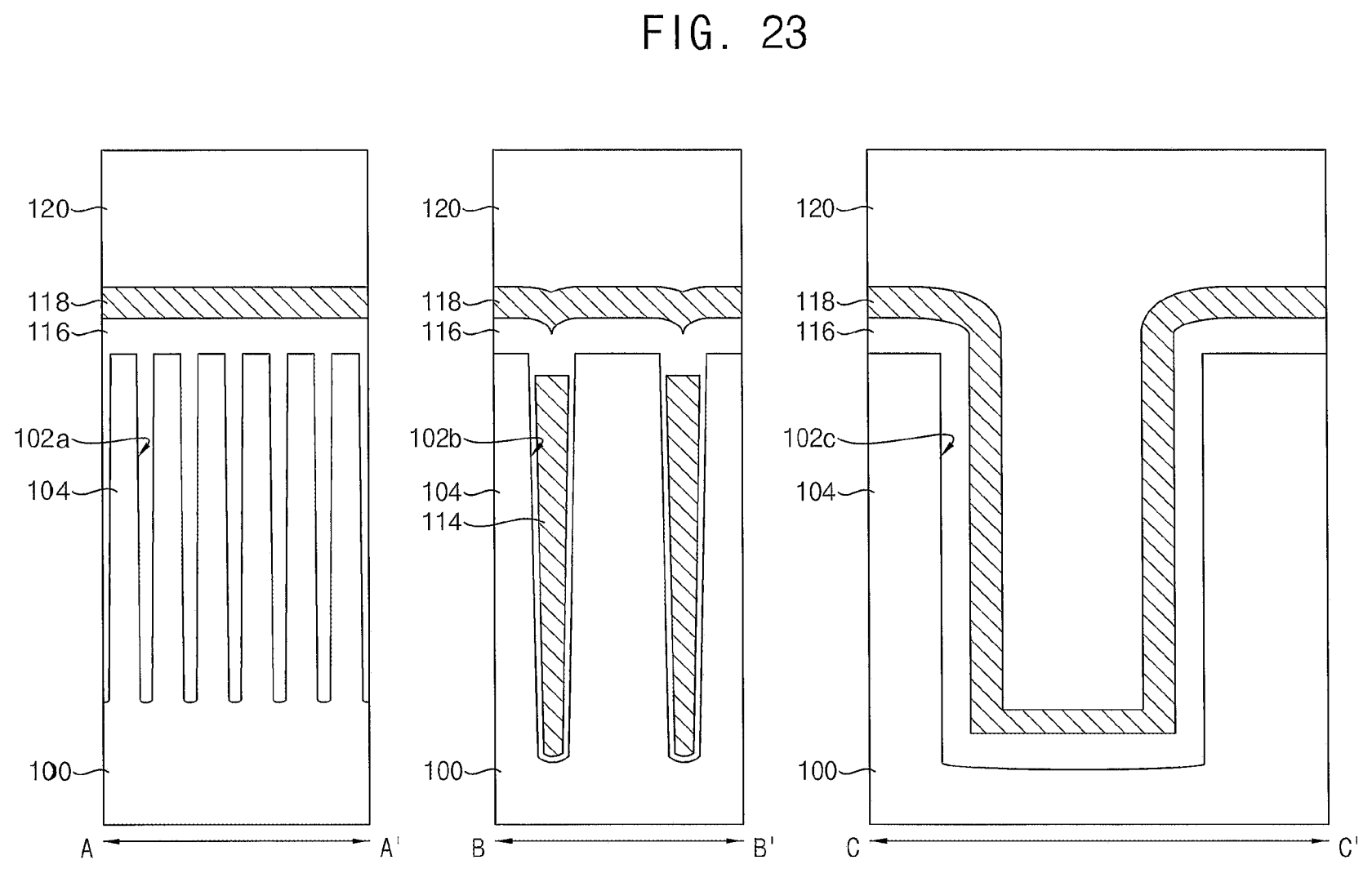

Referring to FIG. 23, a third insulation layer may be formed on the upper surfaces of the first insulation layer 112 and the second insulation layer pattern 114. The third insulation layer may be conformally formed in the third trench 102c. In an implementation, the third insulation layer may not completely fill the third trench 102c. In an implementation, the third insulation layer may include silicon oxide.

In an implementation, the first insulation layer 112 and the third insulation layer may include the same material, so that the first insulation layer 112 and the third insulation layer may be merged with each other. Therefore, hereinafter, a merged layer of the first and third insulation layers is referred to as a first filling insulation layer 116.

A liner layer 118 may be formed on the first filling insulation layer 116, and the liner layer 118 may include an insulation material different from the material of the first filling insulation layer 116. The liner layer 118 may be conformally formed in the third trench 102c. In an implementation, the liner layer 118 may not completely fill the third trench 102c. In an implementation, the liner layer 118 may include silicon nitride.

A second filling insulation layer 120 may be formed on the liner layer 118, and the second filling insulation layer 120 may include an insulation material different from the material of the liner layer 118. The second filling insulation layer 120 may completely fill (e.g., remaining portions of) the third trench 102c. The second filling insulation layer 120 may include silicon oxide having excellent gap filling characteristics. In an implementation, the second filling insulation layer 120 may include TOSZ.

In this case, the liner layer 118 and the second filling insulation layer 120 may not be formed at or in inner portions of the first trench 102a and the second trench 102b in the first region I. The first filling insulation layer 116, the liner layer 118, and the second filling insulation layer 120 may be sequentially stacked in the third trench 102c on the second region II.

Figure 24:
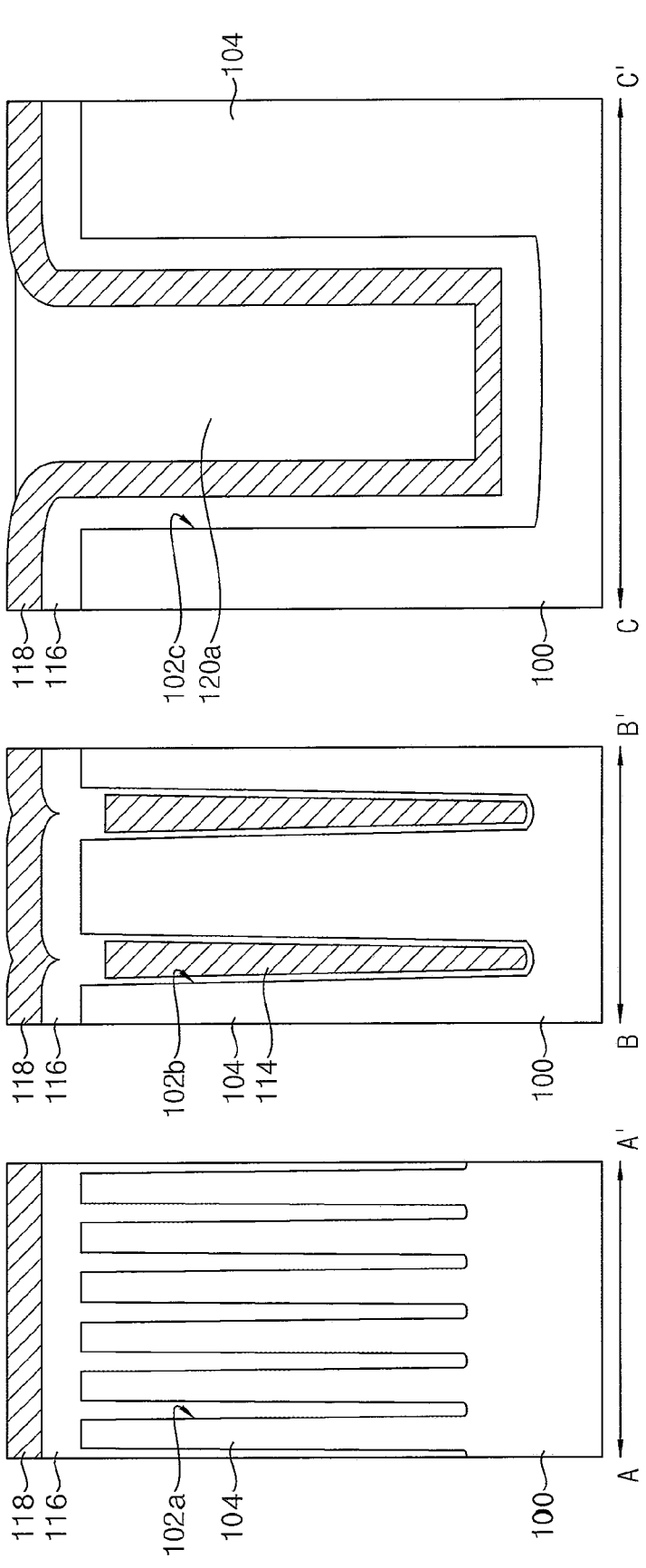

Referring to FIG. 24, the second filling insulation layer 120 may be planarized until an upper surface of the liner layer 118 is exposed. The planarization process may be performed by a chemical mechanical polishing (CMP) process or an etch back process.

As a result of the polishing process, all of the second filling insulation layer 120 on the first region I may be removed to expose the liner layer 118. The second filling insulation layer 120 in the third trench 102c of the second region II may remain, so that a preliminary filling insulation pattern 120a may be formed in the third trench 102c.

Figure 25:
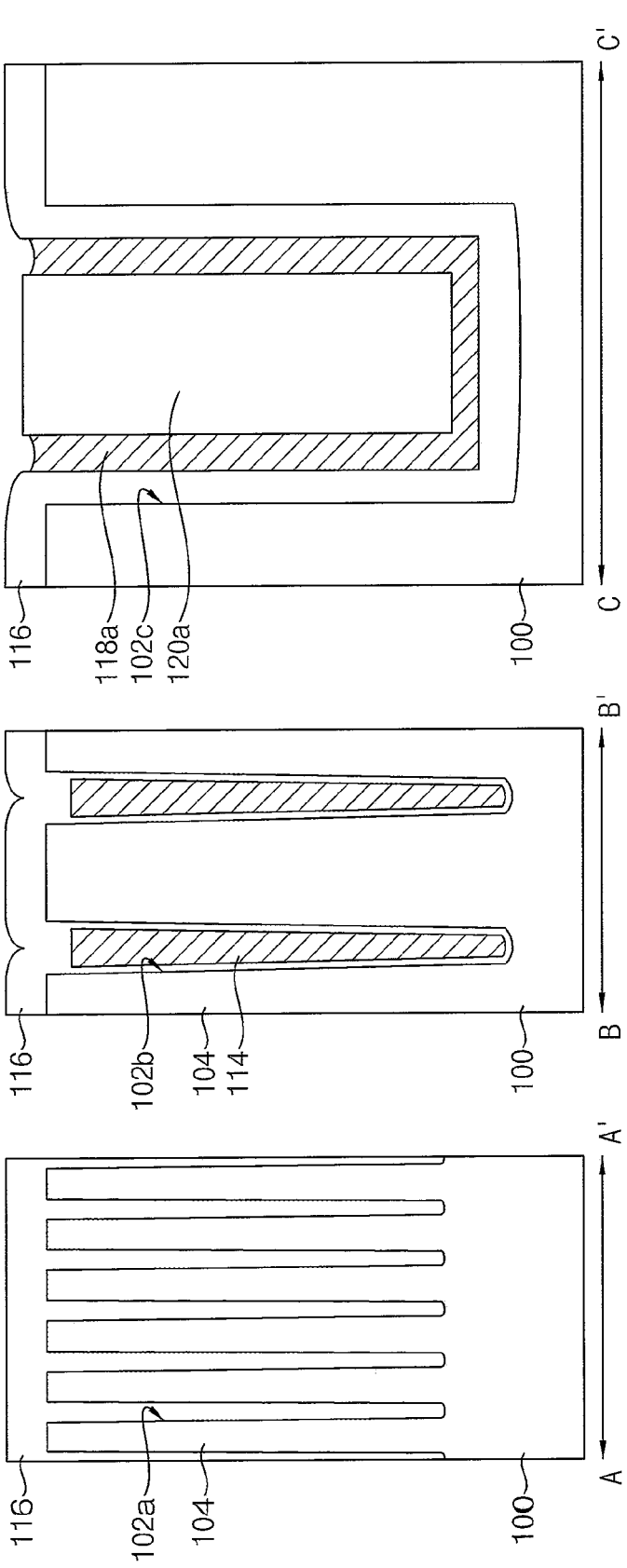

Referring to FIG. 25, a portion of the liner layer 118 may be removed to expose the first filling insulation layer 116.

The removing process of the liner layer 118 may be performed by a wet etching process or a wet cleaning process.

In this case, all of the liner layer 118 on the first region I may be removed to expose the first filling insulation layer 116. The liner layer 118 in the third trench 102c of the second region II may remain to form a preliminary liner pattern 118a, after the removing process. The preliminary liner pattern 118a in the third trench 102c may have a roughly U-shape, in a cross-sectional view.

Accordingly, the first filling insulation layer 116, the first preliminary liner pattern 118a and the preliminary filling insulation pattern 120a may be exposed on the second region II. The first filling insulation layer 116, the first preliminary liner pattern 118a, and the preliminary filling insulation pattern 120a may fill the third trench 102c on the second region II.

The first filling insulation layer 116 may fill the first trench 102a on the first region I. The first filling insulation layer 116 and the second insulation layer pattern 114 may fill the second trench 102b on the first region I. As such, a stacked structure of the insulation layers in each of the first to third trenches 102a, 102b, and 102c may be different from each other.

Figure 26:
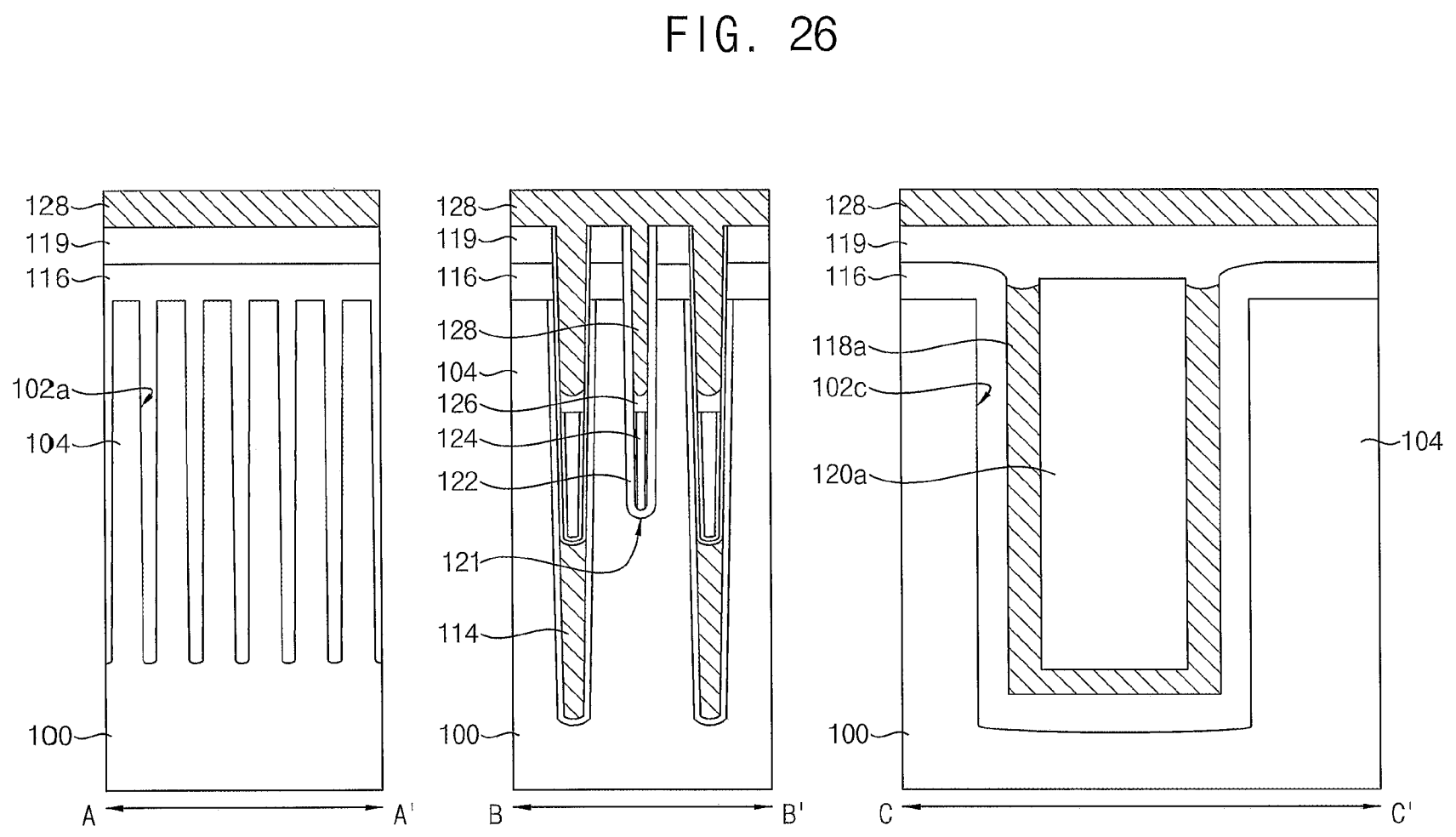

Referring to FIG. 26, a second mask pattern 119 may be formed on the first filling insulation layer 116 on the first region I and the first filling insulation layer 116, the preliminary liner pattern 118a, and the preliminary filling insulation pattern 120a on the second region II. In an implementation, the second mask pattern 119 may include silicon oxide.

The second mask pattern 119 of the first region I may extend in the first direction. The second mask pattern 119 of the second region II may entirely cover the second region II. In an implementation, the second mask pattern 119 may cover all of the first filling insulation layer 116, the preliminary liner pattern 118a, and the preliminary filling insulation pattern 120a on the second region II.

Upper portions of the first filling insulation layer 116, the second insulation layer pattern 114, and the active pattern 104 of the first region I may be partially etched using the second mask pattern 119 as an etch mask to form a gate trench 121 extending in the first direction.

A first gate insulation layer 122 may be conformally formed on an inner surface of the gate trench 121, and a first gate electrode layer may be formed on the first gate insulation layer 122. Thereafter, the first gate electrode layer may be etched by an etch back process to form a first gate electrode 124 in a lower portion of the gate trench 121. The first gate electrode 124 may include a barrier pattern and a metal pattern. In an implementation, a polysilicon pattern 126 may be further formed on the first gate electrode 124.

Thereafter, a first capping layer 128 may be formed on the second mask pattern 119 of the first and second regions II to completely fill remaining parts of the gate trench 121. The first capping layer 128 may include silicon nitride.

Figure 27:
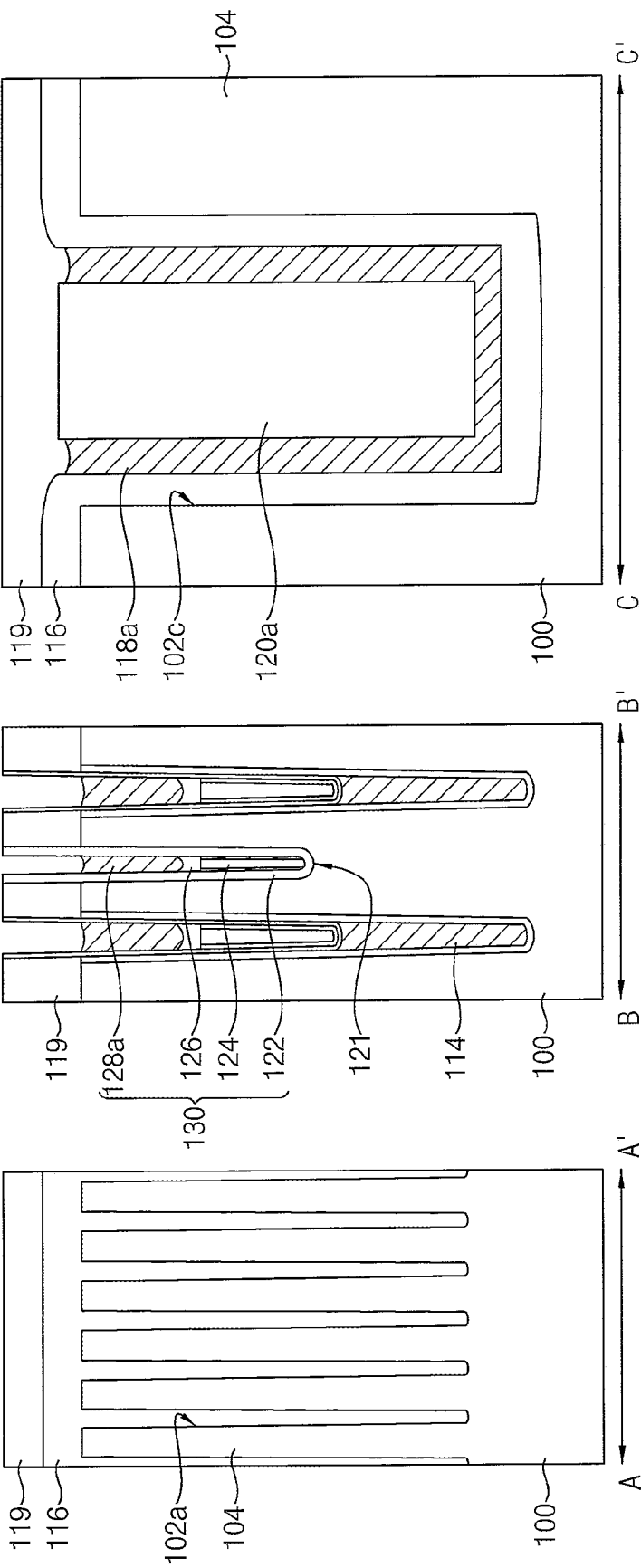
Figure 28:
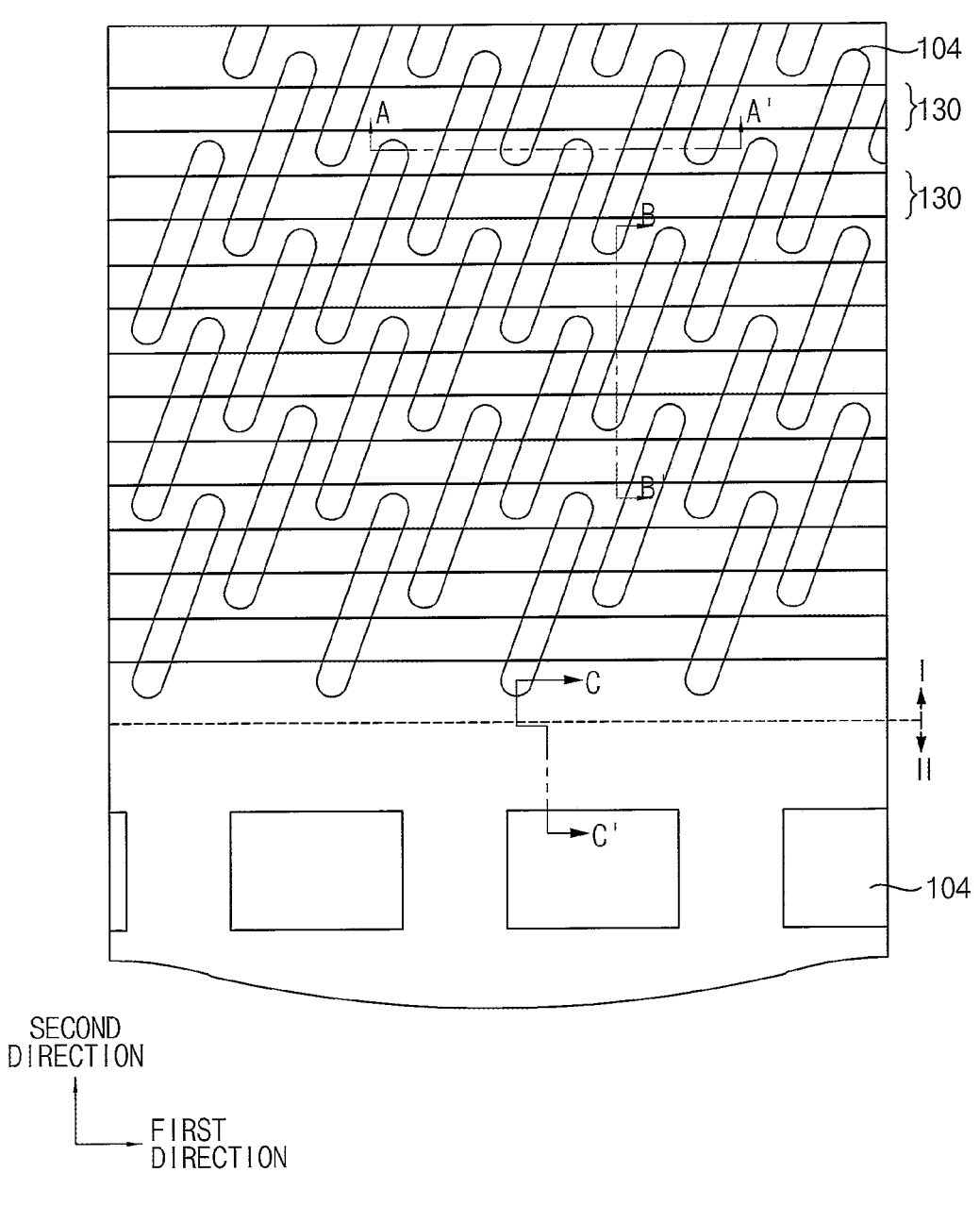

Referring to FIGS. 27 and 28, an upper portion of the first capping layer 128 may be etched by an etch back process, so that the first capping layer 128 may remain only in the gate trench 121. Thus, a first capping layer pattern 128a may be formed at an inner portion of the gate trench 121. In an implementation, an upper surface of the first capping layer pattern 128a may be at substantially the same level as an upper surface of the active pattern 104.

By performing the above process, a first gate structure 130 including the first gate insulation layer 122, the first gate electrode 124, the polysilicon pattern 126, and the first capping layer pattern 128a may be formed in the gate trench 121.

Figure 29:
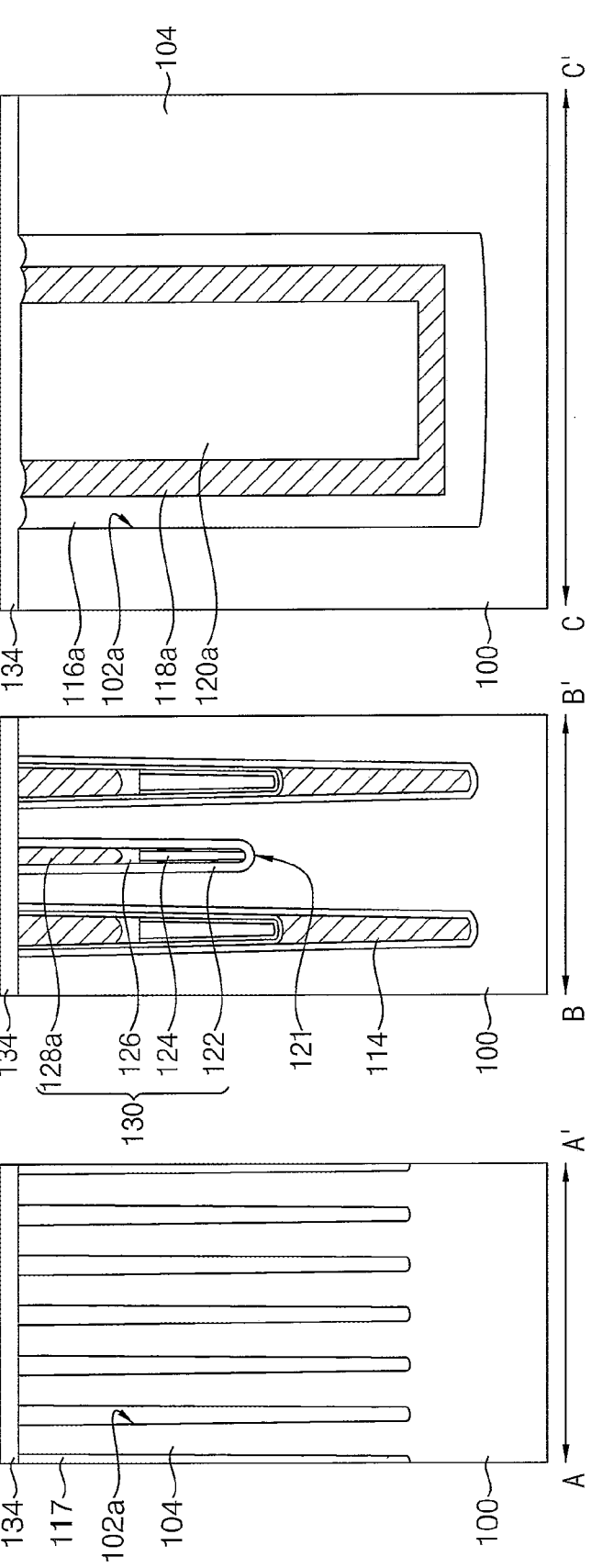

Referring to FIG. 29, the second mask pattern 119 may be removed.

Then, upper portions of the first filling insulation layer 116 and the preliminary filling insulation pattern 120a may be partially removed to expose the upper surfaces of the first region I and the second region II of the substrate 100. The removing process may include a wet etching process or a wet cleaning process.

When the above processes are performed, upper surfaces of the substrate 100, the first insulation layer pattern 117, and the first gate structure 130 may be exposed on the first region I. In addition, the substrate 100, a preliminary inner wall oxide layer pattern 116a, the first preliminary liner pattern 118a, and the preliminary filling insulation pattern 120a may be exposed on the second region II.

Thereafter, a protective oxide layer 134 may be formed to cover the substrate 100, the first insulation layer pattern 117, the first gate structure 130, the preliminary inner wall oxide layer pattern 116a, and the preliminary liner pattern 118a and the preliminary inner wall oxide layer pattern 116a on the first and second regions I and II.

Figure 30:
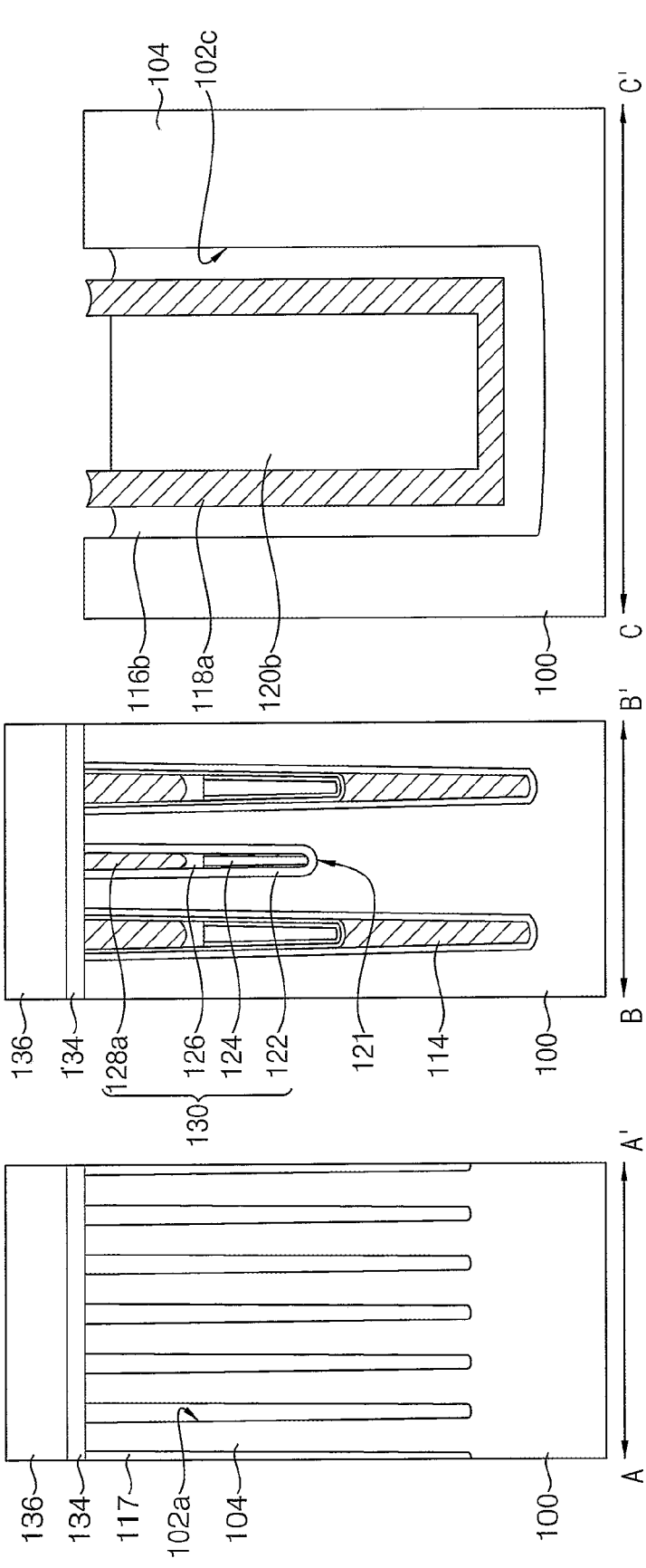

Referring to FIG. 30, a third mask pattern 136 may be formed on the protective oxide layer 134 on the first region I. The third mask pattern 136 may cover the first region I.

The protective oxide layer 134 and the preliminary inner wall oxide layer pattern 116a on the upper surface of the substrate 100 may be partially etched to expose the upper surface of the substrate 100 and the upper sidewall of the third trench 102c on the second region II. In the removing process, an upper portion of the preliminary filling insulation pattern 120a in the third trench 102c may also be removed. The removing process may include a wet etching process. Thus, an inner wall oxide layer pattern 116b and a filling insulation pattern 120b may be formed in the third trench 102c. Through the removing process, upper surfaces of the inner wall oxide layer pattern 116b and the filling insulation pattern 120b may be lower than the upper surfaces of the active pattern 104 in the second region II.

In the removing process, the preliminary liner pattern 118a may not be removed. Therefore, the upper surface of the preliminary liner pattern 118a may protrude from or above the upper surface of the inner wall oxide layer pattern 116b and the filling insulation pattern 120b.

Figure 31:
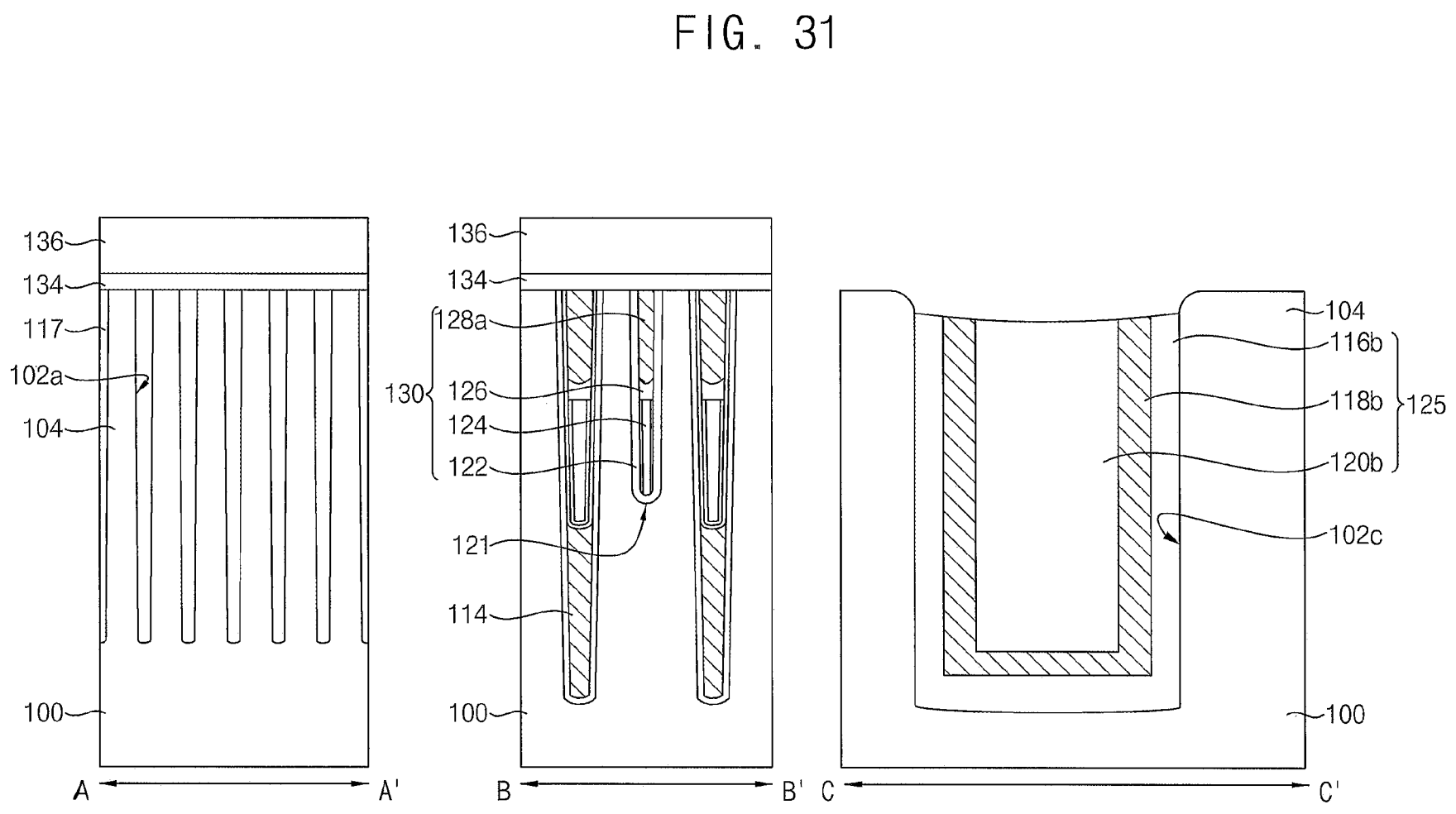

Referring to FIG. 31, a protruding portion of the preliminary liner pattern 118a may be removed to form a liner pattern 118b. The removing process may include a wet etching process and a cleaning process.

The preliminary liner pattern 118a may be etched using phosphoric acid. After the etching process, the cleaning process may be performed using the SC1 solution, which is a mixed solution of aqueous ammonia, hydrogen peroxide, and deionized water.

In the removing process, a boundary portion between the upper surface of the active pattern 104 and the upper sidewall portion of the third trench 102c in the second region II may be partially etched. Thus, the boundary portion may have a more gently rounded shape.

An upper surface of the liner pattern 118b may be lower than an upper surface of the active pattern 104 of the second region II. An upper surface of the liner pattern 118b may not have a portion protruding from upper surfaces of the inner wall oxide layer pattern 116b and the filling insulation pattern 120b. In an implementation, a dent between the liner pattern 118b and the sidewall of the third trench 102c may be removed.

The inner wall oxide layer pattern 116b, the liner pattern 118b, and the filling insulation pattern 120b in the third trench 102c may serve as the isolation structure 125. The upper surface of the isolation structure 125 may be lower than the upper surface of the active pattern 104 in the second region II.

Figure 32:
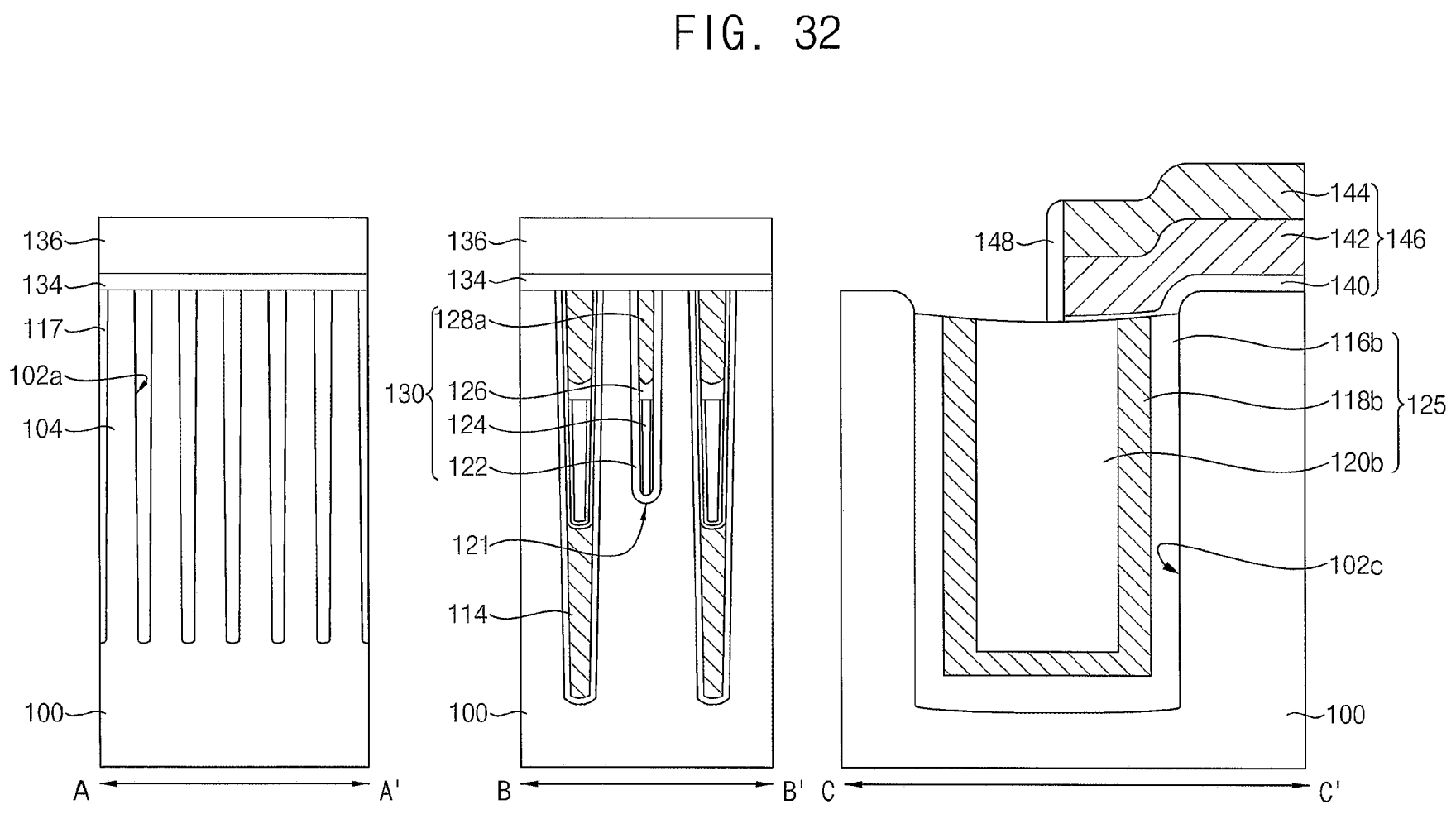

Referring to FIG. 32, a second gate oxide layer may be formed on the upper surface of the exposed active pattern 104 and the upper sidewall of the third trench 102c in the second region II. The second gate oxide layer may be formed by a thermal oxidation process. The second gate oxide layer may include silicon oxide.

A second gate electrode layer may be formed on the second gate oxide layer. The second gate electrode layer may include polysilicon doped with impurities or a metal material.

A second capping layer may be formed on the second gate electrode layer. The second capping layer may include silicon nitride. The second capping layer may be patterned to form a second capping layer pattern 144.

The second gate electrode layer and the second gate oxide layer may be etched using the second capping layer pattern 144 as an etch mask. Thus, a second gate structure 146 including a second gate oxide layer pattern 140, a second gate electrode 142, and the second capping layer pattern 144 may be formed on the active pattern 104 and the isolation structure 125 in the second region I. A first spacer 148 may be formed on a sidewall of the second gate structure 146. Impurities may be doped into the upper portions of the substrate 100 adjacent to both sides of the second gate structure 146 to form impurity regions.

Thus, a transistor serving as a core peripheral circuit may be formed on the second region II.

Figure 33:
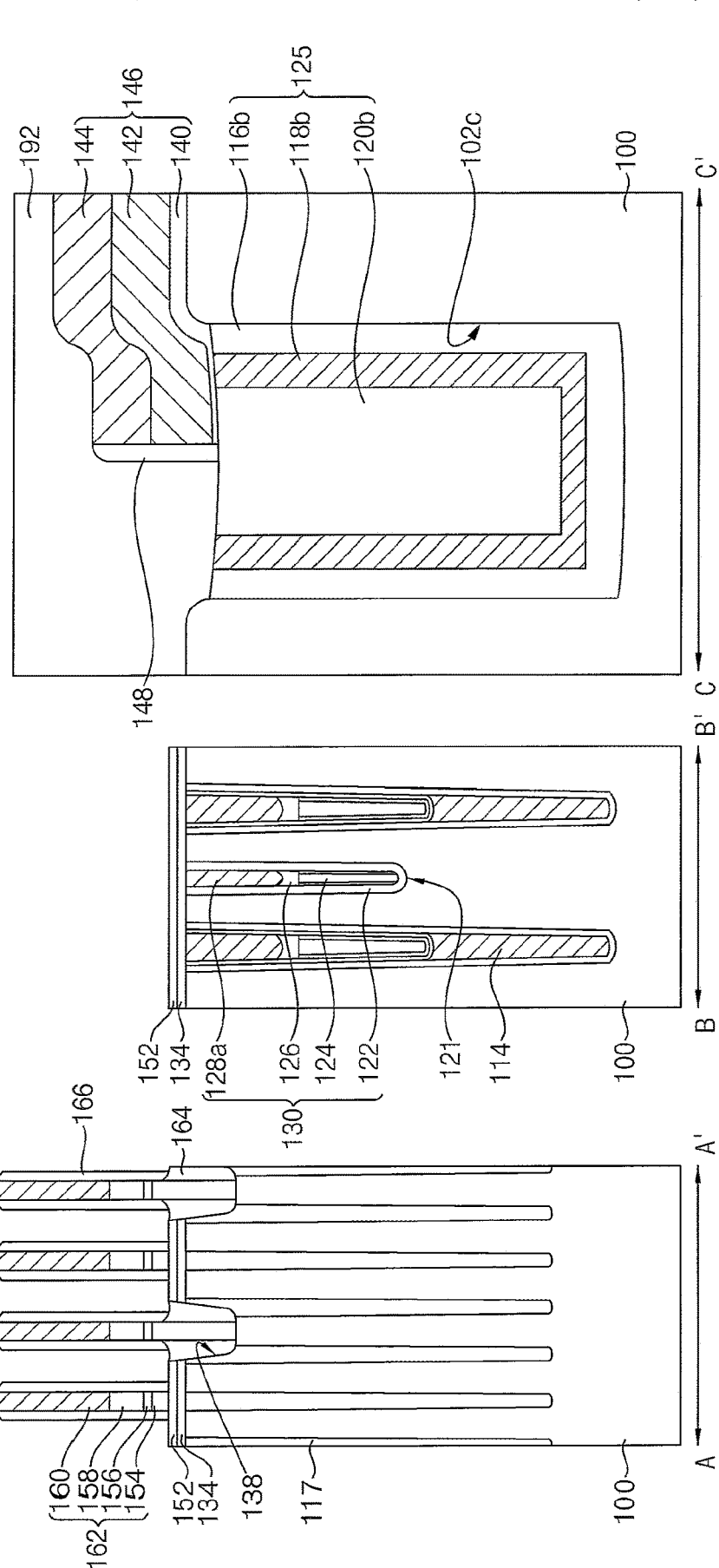

Referring to FIG. 33, the third mask pattern 136 may be removed. Then, a mask insulation pattern 192 may be formed to cover the second region.

An etch stop layer 152 may be formed on the protective oxide layer 134 on the first region I. The etch stop layer 152 may include silicon nitride.

A first polysilicon layer may be formed on the etch stop layer 152. On the first region, a portion of the first polysilicon layer, and the etch stop layer 152, the protective oxide layer, and the substrate 100 thereunder may be etched to form a first opening. The first opening 138 may correspond to a portion for forming a bit line contact. In the process for forming the first opening 138, upper portions of the first and second cell isolation structures formed in the first and second trenches 102a and 102b may also be partially removed.

A second polysilicon layer may be formed to fill the first opening 138, and the second polysilicon layer may be planarized to form a polysilicon pattern in the first opening 138.

The first polysilicon layer and the polysilicon pattern may include the same material, so that the first polysilicon layer and the polysilicon pattern may be merged into one layer. Hereinafter, the merged one layer including the first polysilicon layer and the polysilicon pattern is referred to as a first electrode layer.

A barrier layer and a second electrode layer may be formed on the first electrode layer. The barrier layer may include, e.g., a metal such as titanium (Ti) or tantalum (Ta), or a metal nitride such as titanium nitride or tantalum nitride. The second electrode layer may include a metal. A third capping layer pattern 160 may be formed on the second electrode layer. The second electrode layer, the barrier layer, and the first electrode layer may be sequentially etched using the third capping layer pattern 160 as an etch mask. Thus, the bit line structure 162 in which a first conductive pattern 154, a barrier pattern 156, a first metal pattern 158, and the third capping layer pattern 160 are stacked may be formed on the first region of the substrate 100.

A lower insulation pattern 164 may be formed to fill a gap between the lower sidewall of the bit line structure 162 and the first opening 138. In an implementation, a second spacer 166 may be formed on a sidewall of the bit line structure 162.

Figure 34:
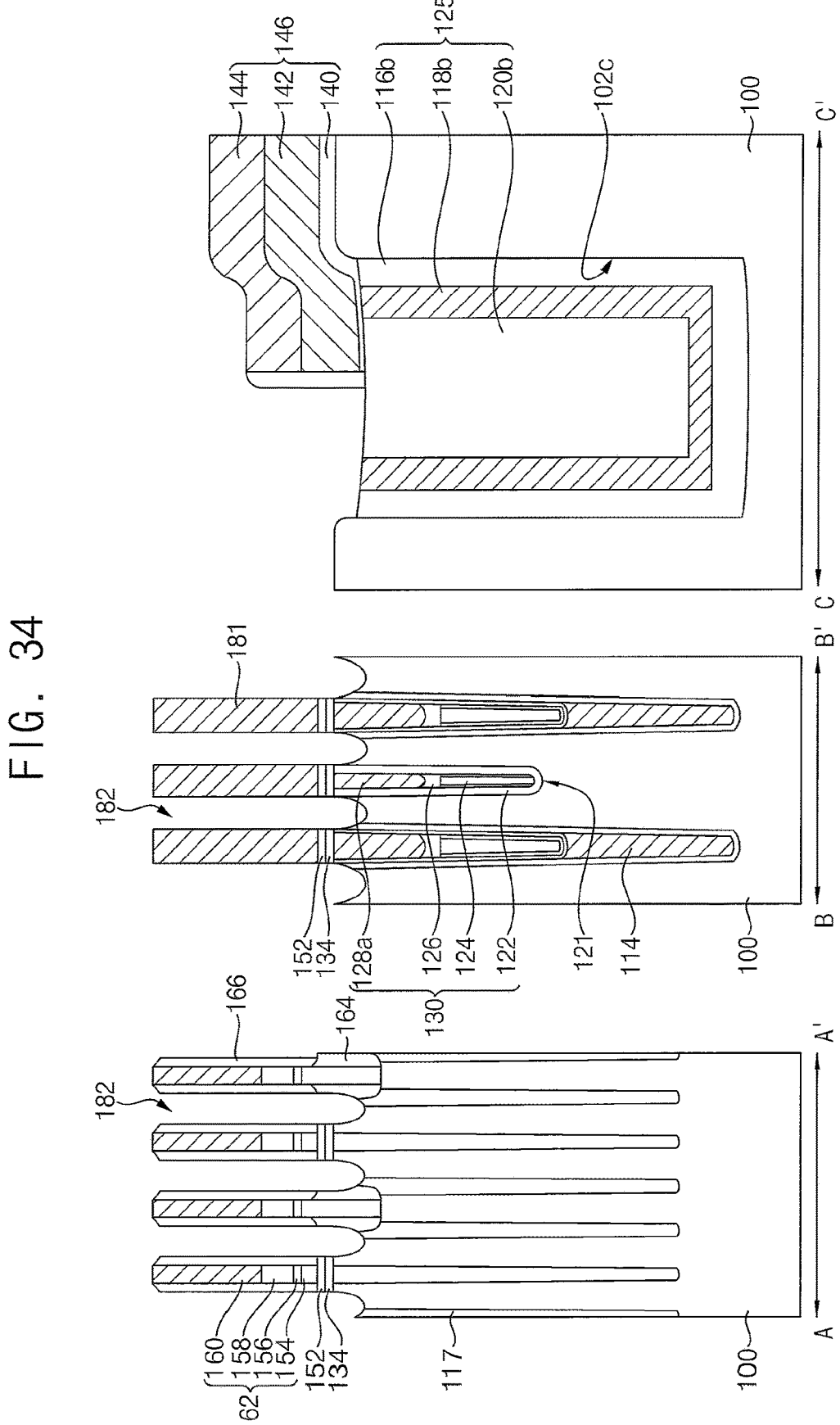

Referring to FIG. 34, a first insulating interlayer may be formed on the etch stop layer 152 to fill a gap between the second spacers 166. Thereafter, the first insulating interlayer may be planarized until an upper surface of the bit line structure 162 may be exposed.

A portion of the first insulating interlayer may be etched to form a first interlayer insulation pattern having a second opening. The etch stop layer 152 may be exposed on a bottom surface of the second opening. A fence insulation layer may be formed in the second opening, and the fence insulation layer may be planarized to form a fence insulation pattern 181. In an implementation, the fence insulation pattern 181 may include silicon nitride. Then, the first interlayer insulation pattern may be removed. Thus, a third opening may be formed at a removed portion of the first interlayer insulation pattern. The third opening may be defined by the bit line structure and the fence insulation pattern.

The etch stop layer 152, the protective oxide layer 134, the lower insulation pattern 164, and an upper portion of the substrate 100 exposed on the bottom surface of the third opening may be etched to form a contact hole 182 exposing the active pattern 104.

Figure 35:
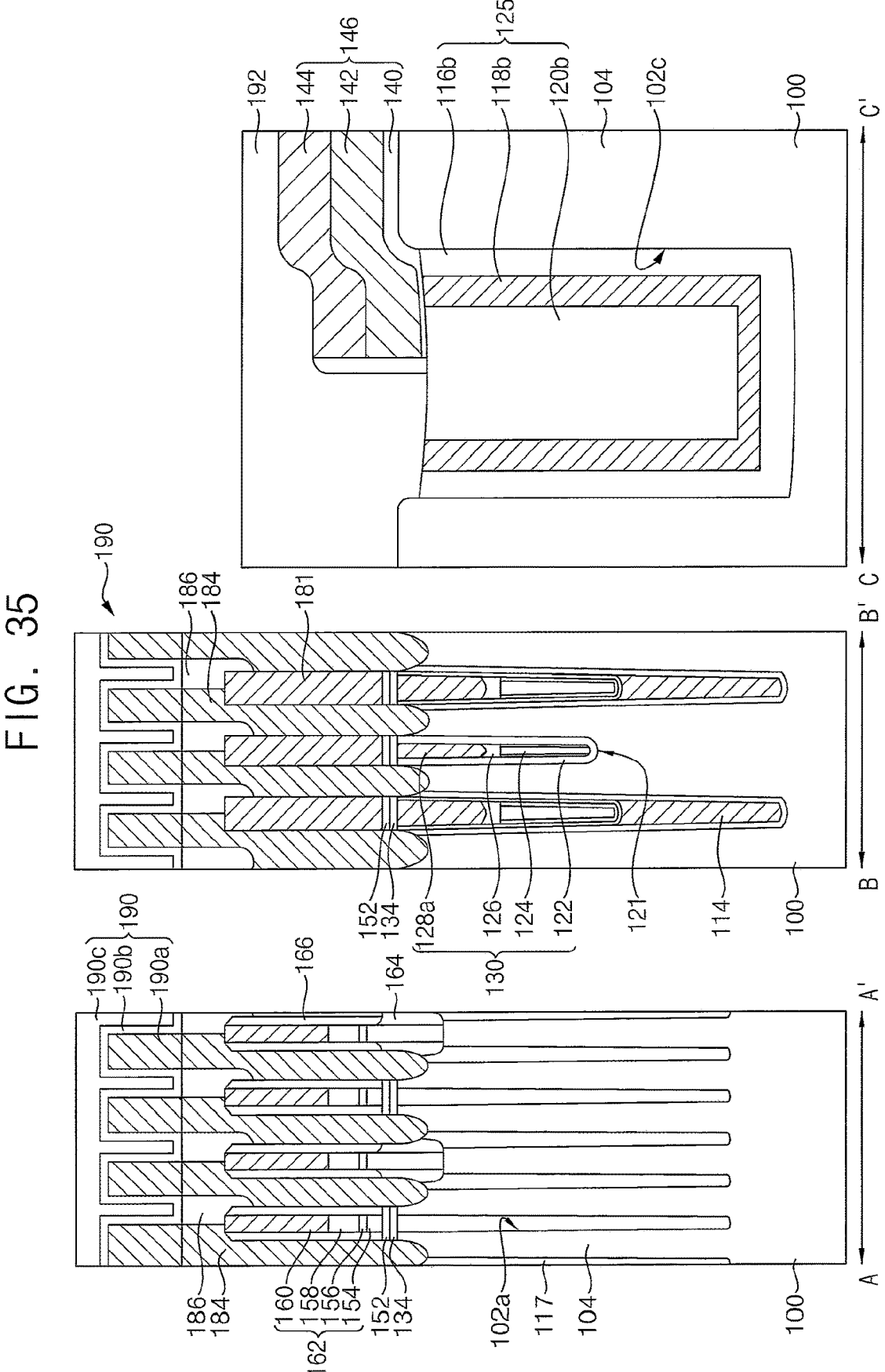

Referring to FIG. 35, a contact plug 184 may be formed to fill contact hole 182, and the contact plug 184 may have an upper surface higher than that of the bit line structure 162. An upper insulation pattern 186 may be formed to fill a space between the contact plugs 184.

A capacitor 190 may be formed on an upper surface of the contact plug 184. The capacitor 190 may include a lower electrode 190*a*, a dielectric layer 190*b*, and an upper electrode 190*c*.

By way of summation and review, characteristics of transistors may be changed by an isolation structure.

One or more embodiments may provide a semiconductor device including an isolation structure.

One or more embodiments may provide a semiconductor device having good characteristics.

A semiconductor device in accordance with example embodiments may include the isolation structure without a protruding portion of the nitride liner. Thus, a dent may not be generated by the protruding portion. Therefore, the gate electrode layer formed on the isolation structure can be easily removed, so that a bridge defect in which the gate electrodes are connected to each other may be decreased.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate including a trench;
an isolation structure including an inner wall oxide layer pattern, a liner pattern, and a filling insulation pattern stacked in the trench; and
a gate structure on and in direct contact with both a top surface of the substrate and a top surface of the isolation structure,
wherein:
the inner wall oxide layer pattern and the liner pattern are conformally formed on a surface of the trench,
an uppermost part of top surfaces of each of the inner wall oxide layer pattern, the liner pattern, and the filling insulation pattern are lower than a top surface of the substrate, and
a boundary between a top surface of the inner wall oxide layer pattern and a top surface of the liner pattern has no step difference.

2. The semiconductor device as claimed in claim 1, wherein the liner pattern does not protrude above the top surfaces of the inner wall oxide layer pattern and the filling insulation pattern.

3. The semiconductor device as claimed in claim 1, wherein a boundary portion between the top surface of the substrate and an upper sidewall of the trench has a rounded shape.

4. The semiconductor device as claimed in claim 1, wherein:
the inner wall oxide layer pattern and the filling insulation pattern each include silicon oxide, and
the liner pattern includes silicon nitride.

5. The semiconductor device as claimed in claim 1, wherein an uppermost part of the top surface of the inner wall oxide layer pattern is at the same height as or is higher than an uppermost part of the top surface of the liner pattern.

6. The semiconductor device as claimed in claim 1, wherein the top surface of the inner wall oxide layer pattern and the top surface of the liner pattern have a downward slope.

7. The semiconductor device as claimed in claim 1, wherein:
the gate structure includes a gate oxide layer pattern, a gate electrode, and a capping layer pattern,
the gate oxide layer pattern is on the top surface of the substrate and an upper sidewall of the trench higher than the top surface of the inner wall oxide layer pattern,
the gate oxide layer pattern on the top surface of the substrate and the upper sidewall of the trench higher than the uppermost part of the top surface of the inner wall oxide layer pattern has a first thickness, and
the gate oxide layer pattern on a top surface of the isolation structure has a second thickness that is less than the first thickness.

8. A semiconductor device, comprising:
a substrate including a trench;
an inner wall oxide layer pattern conformally on an inner wall of the trench, the inner wall oxide layer pattern having a top surface lower than a top surface of the substrate so as to expose an upper sidewall of the trench;

17 a liner pattern conformally on the inner wall oxide layer pattern;

a filling insulation pattern on the liner pattern, the filling insulation pattern filling remaining parts of the trench; and a gate structure directly contacting a surface of the substrate and the inner wall oxide layer pattern, the liner pattern, and the filling insulation pattern in the trench, the gate structure including a gate oxide layer pattern, a gate electrode, and a capping layer pattern, wherein:

an uppermost part of top surfaces of each of the inner wall oxide layer pattern, the liner pattern, and the filling insulation pattern in the trench are lower than the top surface of the substrate such that the upper sidewall of the trench is exposed, and the uppermost part of the top surface of the inner wall oxide layer pattern is the same as or higher than an uppermost part of the top surface of the liner pattern.

9. The semiconductor device as claimed in claim 8, wherein a boundary between the top surface of the inner wall oxide layer pattern and the top surface of the liner pattern has no step difference.

10. The semiconductor device as claimed in claim 8, wherein the liner pattern does not protrude above the top surfaces of the inner wall oxide layer pattern and the filling insulation pattern.

11. The semiconductor device as claimed in claim 8, wherein a boundary portion between the top surface of the substrate and the upper sidewall of the trench has a rounded shape.

12. The semiconductor device as claimed in claim 8, wherein:

the inner wall oxide layer pattern and the filling insulation pattern each include silicon oxide, and the liner pattern includes silicon nitride.

13. The semiconductor device as claimed in claim 8, wherein:

the uppermost part of the top surface of the inner wall oxide layer pattern is higher than the uppermost part of the top surface of the liner pattern, and the top surface of the inner wall oxide layer pattern and the top surface of the liner pattern have a downward slope.

14. The semiconductor device as claimed in claim 8, wherein:

the gate oxide layer pattern is on the top surface of the substrate and the upper sidewall of the trench higher than the top surface of the inner wall oxide layer pattern, the gate oxide layer pattern on the top surface of the substrate and the upper sidewall of the trench higher than the top surface of the inner wall oxide layer pattern has a first thickness, and

the gate oxide layer pattern on the inner wall oxide layer pattern, the liner pattern, and the filling insulation pattern in the trench has a second thickness that is less than the first thickness.

15. A semiconductor device, comprising:

a substrate including a first region and a second region;

first trenches in the first region of the substrate;

a first isolation structure in each of the first trenches, the first isolation structure including an insulation material;

memory cells on the substrate and the first isolation structure in the first region;

second trenches in the second region of the substrate;

a second isolation structure in each of the second trenches, the second isolation structure including an inner wall oxide layer pattern, a liner pattern, and a filling insulation pattern sequentially stacked; and a gate structure directly contacting the substrate and the inner wall oxide layer pattern, the liner pattern, and the filling insulation pattern included in the second isolation structure in the second region, the gate structure including a gate oxide layer pattern, a gate electrode, and a capping layer pattern, wherein:

an uppermost part of a top surface of the second isolation structure in the second trench is lower than a top surface of the substrate such that an upper sidewall of the second trench is exposed, and an uppermost part of a top surface of the inner wall oxide layer pattern is at a same level as or higher than an uppermost part of a top surface of the liner pattern.

16. The semiconductor device as claimed in claim 15, wherein a boundary between the top surface of the inner wall oxide layer pattern and the top surface of the liner pattern has no step difference.

17. The semiconductor device as claimed in claim 15, wherein a boundary portion between the top surface of the substrate and an upper sidewall of the second trench has a rounded shape.

18. The semiconductor device as claimed in claim 15, wherein an inner width of the first trench is less than an inner width of the second trench.

19. The semiconductor device as claimed in claim 15, wherein the first isolation structure has a stacked structure different from a stacked structure of the second isolation structure.

20. The semiconductor device as claimed in claim 1, wherein the gate structure includes a gate oxide layer pattern, a gate electrode, and a capping layer pattern, and wherein the gate oxide layer pattern directly contacts the top surface of the inner wall oxide layer pattern, the top surface of the liner pattern, and a top surface of the filling insulation pattern.

* * * * *